(12) United States Patent
Gehlen et al.

(10) Patent No.: US 11,940,848 B2
(45) Date of Patent: Mar. 26, 2024

(54) ELECTRONIC DEVICES WITH BORDERLESS DISPLAYS

(71) Applicant: Apple Inc., Cupertino, CA (US)

(72) Inventors: Elmar Gehlen, San Jose, CA (US); Zhen Zhang, Sunnyvale, CA (US); Francois R. Jacob, Sunnyvale, CA (US); Paul S. Drzaic, Morgan Hill, CA (US); Han-Chieh Chang, Sunnyvale, CA (US); Abbas Jamshidi Roudbari, Saratoga, CA (US); Anshi Liang, San Jose, CA (US); Hopil Bae, Palo Alto, CA (US); Mahdi Farrokh Baroughi, Santa Clara, CA (US); Marc J. DeVincentis, Palo Alto, CA (US); Paolo Sacchetto, Cupertino, CA (US); Tiffany T. Moy, Redwood City, CA (US); Warren S. Rieutort-Louis, Cupertino, CA (US); Yong Sun, Sunnyvale, CA (US); Jonathan P. Mar, San Mateo, CA (US); Zuoqian Wang, Fremont, CA (US); Ian D. Tracy, Kirkwood, NY (US); Sunggu Kang, San Jose, CA (US); Jaein Choi, San Jose, CA (US); Steven E. Molesa, San Jose, CA (US); Sandeep Chalasani, San Jose, CA (US); Jui-Chih Liao, Hsinchu (TW); Xin Zhao, San Jose, CA (US); Izhar Z. Ahmed, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 255 days.

(21) Appl. No.: 17/392,138

(22) Filed: Aug. 2, 2021

(65) Prior Publication Data
US 2022/0050506 A1 Feb. 17, 2022

Related U.S. Application Data

(60) Provisional application No. 63/065,951, filed on Aug. 14, 2020.

(51) Int. Cl.
*G09G 3/3225* (2016.01)
*G06F 1/16* (2006.01)
(Continued)

(52) U.S. Cl.
CPC ............ *G06F 1/1656* (2013.01); *G06F 1/163* (2013.01); *G09G 3/3225* (2013.01); *H01L 25/0753* (2013.01); *H01L 25/167* (2013.01)

(58) Field of Classification Search
CPC ..... G06F 1/1656; G06F 1/163; G09G 3/3225; H01L 25/0753; H01L 25/167
See application file for complete search history.

(56) References Cited

U.S. PATENT DOCUMENTS 6,476,783 B2 11/2002 Matthies et al.
6,667,791 B2 12/2003 Sanford et al.
(Continued)

FOREIGN PATENT DOCUMENTS

CN 110827709 A 2/2020
EP 3690940 A1 8/2020
(Continued)

*Primary Examiner* — Tracie Y Green
(74) *Attorney, Agent, or Firm* — Treyz Law Group, P.C.; G. Victor Treyz; Jinie M. Guihan

(57) ABSTRACT

An electronic device display may have pixels formed from crystalline semiconductor light-emitting diode dies, organic light-emitting diodes, or other pixel structures. The pixels may be formed on a display panel substrate. A display panel may extend continuously across the display or multiple display panels may be tiled in two dimensions to cover a larger display area. Interconnect substrates may have outwardly facing contacts that are electrically shorted to cor-
(Continued)

responding inwardly facing contacts such as inwardly facing metal pillars associated with the display panels. The interconnect substrates may be supported by glass layers. Integrated circuits may be embedded in the display panels and/or in the interconnect substrates. A display may have an active area with pixels that includes non-spline pixels in a non-spline display portion located above a straight edge of the display and spline pixel in a spline display portion located above a curved edge of the display.

28 Claims, 25 Drawing Sheets

(51) Int. Cl.
*H01L 25/075* (2006.01)
*H01L 25/16* (2023.01)

(56) References Cited

U.S. PATENT DOCUMENTS

| | | | |
|---|---|---|---|
| 9,671,635 B2 | 6/2017 | Paolini, Jr. | |
| 9,942,978 B2 | 4/2018 | Lee | |
| 10,126,581 B2 | 11/2018 | Sano et al. | |
| 2013/0241076 A1* | 9/2013 | Mandlik | H10K 59/32 |
| | | | 257/E23.116 |
| 2015/0311960 A1* | 10/2015 | Samardzija | H01Q 1/273 |
| | | | 455/90.3 |
| 2016/0014882 A1 | 1/2016 | Jongman et al. | |
| 2017/0040306 A1 | 2/2017 | Kim et al. | |
| 2020/0243738 A1 | 7/2020 | Feng et al. | |
| 2021/0359185 A1* | 11/2021 | Garner | B23K 26/382 |
| 2021/0399020 A1* | 12/2021 | Van Eessen | H01L 27/1262 |

FOREIGN PATENT DOCUMENTS

| | | |
|---|---|---|
| KR | 20170135468 A | 12/2017 |
| WO | 2016122704 A1 | 8/2016 |

* cited by examiner

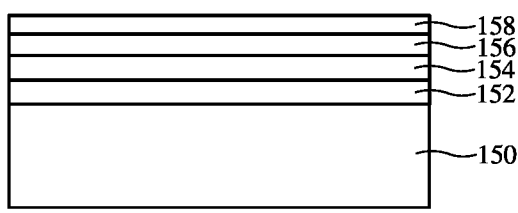
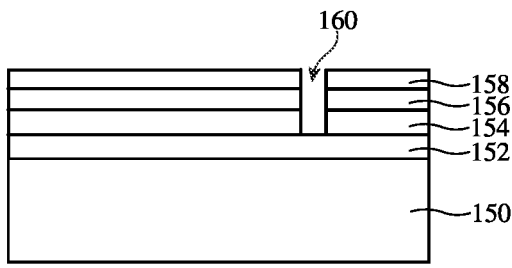
FIG. 15          FIG. 16
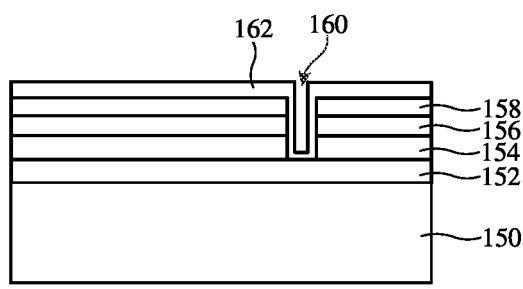
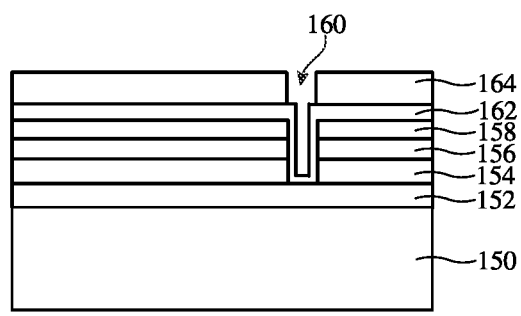
FIG. 17          FIG. 18
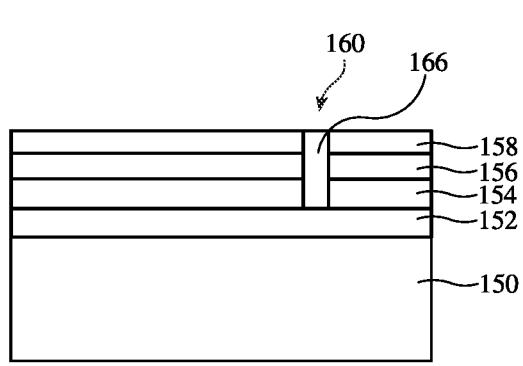
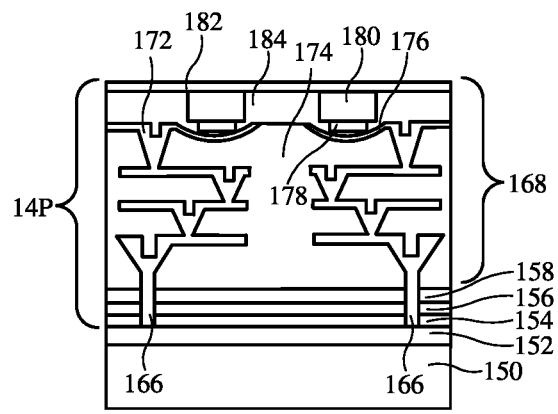
FIG. 19          FIG. 20

ELECTRONIC DEVICES WITH BORDERLESS DISPLAYS

This application claims the benefit of provisional patent application No. 63/065,951, filed Aug. 14, 2020, which is hereby incorporated by reference herein in its entirety.

FIELD

This relates generally to electronic devices, and, more particularly, to electronic devices with displays.

BACKGROUND

Electronic devices often have displays. A display may have an active area with pixels for displaying an image for a user. Inactive border areas are free of pixels and do not display images. If care is not taken, the inactive border areas of a display may be overly large and unsightly.

SUMMARY

An electronic device display may have pixels formed from crystalline semiconductor light-emitting diode dies, organic light-emitting diodes, or other pixel structures. The pixels may be formed on a display panel substrate. A display panel may extend continuously across a display or multiple display panels may be arranged in a tiled fashion to cover a larger display area.

Interconnect substrates may have outwardly facing contacts that are electrically shorted to corresponding inwardly facing contacts such as inwardly facing metal pillars associated with the display panels. The interconnect substrates may have interconnects that help route signals for the display panels.

The interconnect substrates may be supported by supporting glass layers. Integrated circuits may be embedded in the display panels, may be embedded in the interconnect substrates, and/or may be mounted on the surfaces of display panels, interconnect substrates, and/or supporting glass panels. If desired, signals for the pixels of the display may be routed to interconnects in an interconnect substrate using through-glass vias formed in supporting glass layers. The interconnects may distribute power signals, data signals, and control signals directly to the pixels or to pixel driver circuits that, in turn, distribute signals to multiple associated pixels.

A display may have an active area with pixels configured to display images for a user. A display may be mounted in an electronic device housing with curved corners. The display may include non-spline pixels in a non-spline display portion associated with a straight edge of the display (e.g., pixels in columns extending vertically from a horizontal straight edge along the lower end of the display). The display may also include spline pixels in a spline display portion associated with a curved edge of the display (e.g., pixels in columns extending vertically from the curved edge of the display).

The display may have multiple layers of metal such as first, second, third, and fourth layers of metal. Encapsulation dam structures may run along the periphery of the display. In some configurations, bonding pads on the display panel may include spline data pads for pixels in the spline region of the display and non-spline data pads for pixel in the non-spline display region. The spline data pads may be located between at least some of the non-spline data pads and the dam structures. The dam structures may be located between a first set of pads that includes power supply pads and includes touch sensor pads and a second set of pads that includes the spline pads and includes non-spline pads.

BRIEF DESCRIPTION OF THE DRAWINGS

FIGS. 15, 16, 17, 18, 19, and 20 are cross-sectional side views of an illustrative display during fabrication in accordance with an embodiment.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies).

Figure 1:
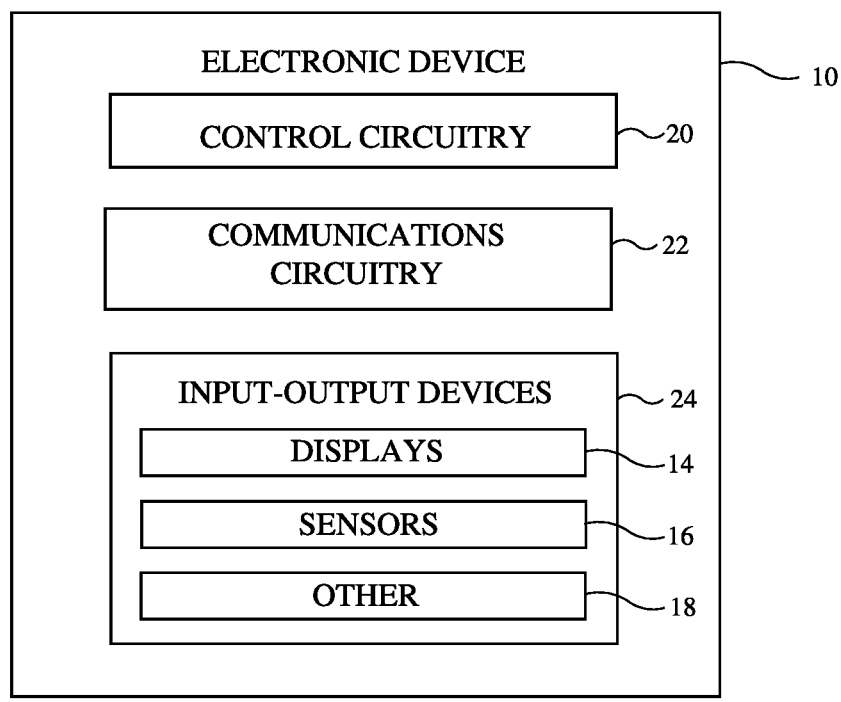
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a wristwatch, cellular telephone, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed on one or more substrates such as one or more flexible substrates (e.g., display 14 may be formed from a flexible display panel). Conductive electrodes for a capacitive touch sensor may be incorporated into a display panel and/or an array of indium tin oxide electrodes or other transparent conductive electrodes may overlap the pixels of a display panel. Capacitive touch sensor electrodes may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
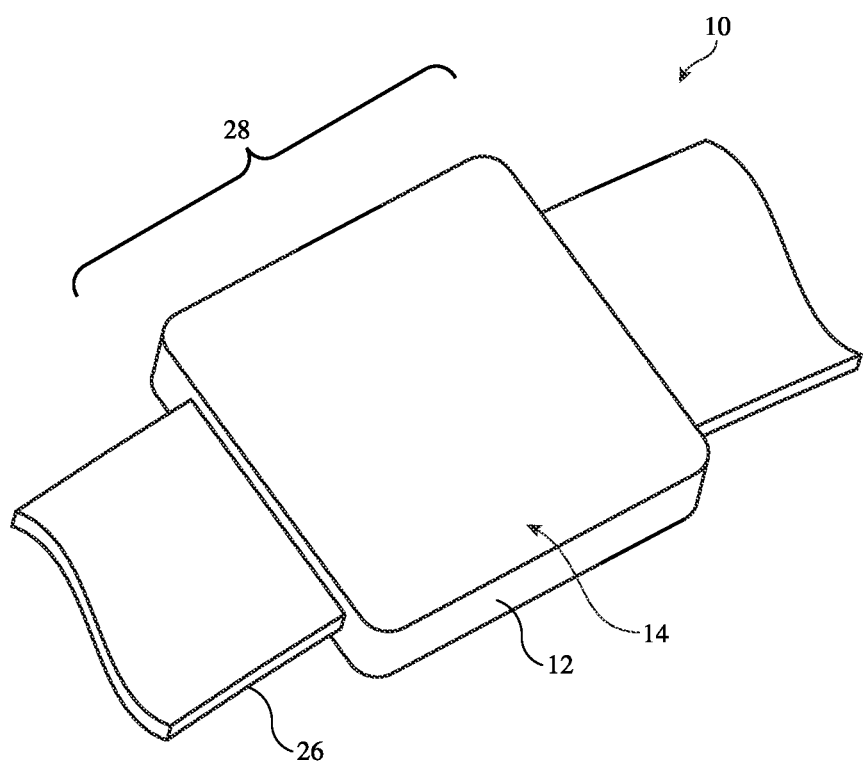
FIG. 2 is a perspective view of an illustrative electronic device with a display in accordance with an embodiment.

FIG. 2 is a perspective view of electronic device 10 in an illustrative configuration in which device 10 is a wearable electronic device such as a wristwatch. As shown in FIG. 2, device 10 may have a band such as band 26 and a main unit such as main unit 28 that is coupled to band 26. Display 14 may cover some or all of the front face of main unit 28. Touch sensor circuitry such as two-dimensional capacitive touch sensor circuitry may be incorporated into display 14. Band 26, which may sometimes be referred to as a strap, wrist strap, watch strap, wrist band, or watch band, may be used to secure main unit 28 to the wrist of a user.

Main unit 28 may have a housing such as housing 12. Housing 12 may form front and rear housing walls, sidewall structures, and/or internal supporting structures (e.g., a frame, midplate member, etc.) for main unit 28. Glass structures, transparent polymer structures, image transport layer structures, and/or other transparent structures that cover display 14 and other portions of device 10 may provide structural support for device 10 and may sometimes be referred to as housing structures. For example, a transparent housing portion such as a glass or polymer housing structure that covers and protects a pixel array in display 14 may serve as a display cover layer for the pixel array while also serving as a housing wall on the front face of device 10. The portions of housing 12 on the sidewall and rear wall of device 10 may be formed from transparent structures and/or opaque structures.

Device 10 of FIG. 2 has a rectangular outline (rectangular periphery) with four rounded corners (e.g., the front face of device 10 may be square). If desired, device 10 may have other shapes (e.g., a circular shape, a rectangular shape with edges of unequal lengths, and/or other shapes). The configuration of FIG. 2 is illustrative.

If desired, openings may be formed in the surfaces of device 10. For example, openings may be formed to accommodate speakers, cable connectors, microphones, buttons, and/or other components. Openings such as connector openings may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

It may be desirable to minimize the borders of display 14. This may be accomplished by attaching a pixel array to one or more underlying substrates using vias and/or by bending a flexible substrate out of the plane of the pixel array.

Figure 3:
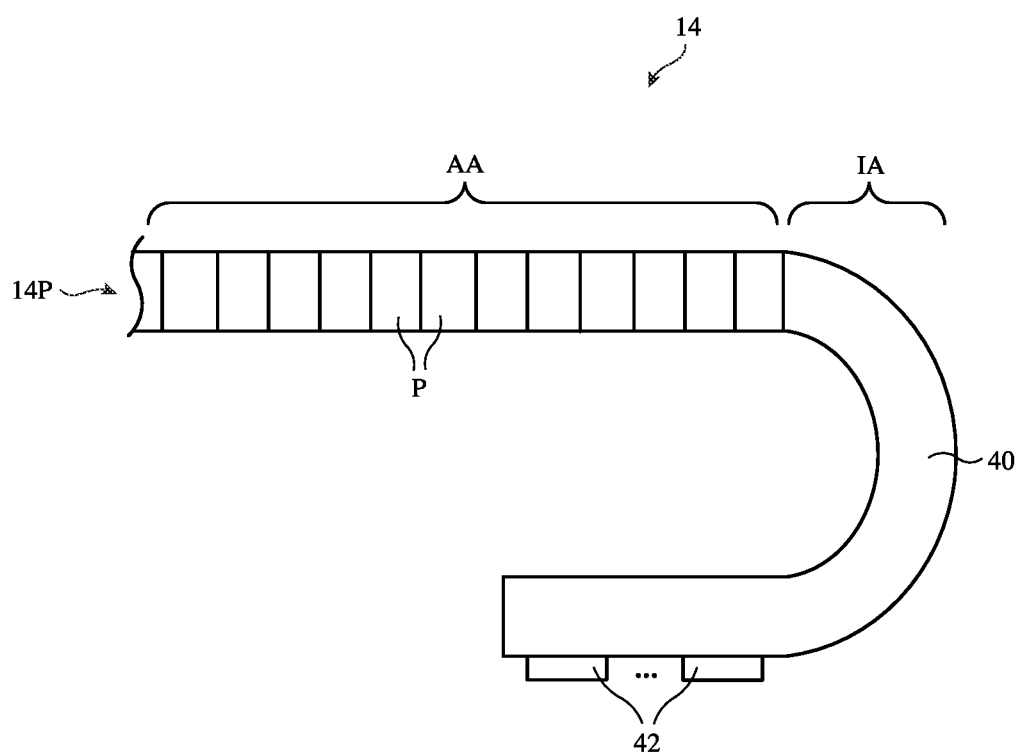
FIG. 3 is a cross-sectional side view of an illustrative display with a bent tail inactive region in accordance with an embodiment.

In a first illustrative configuration, which is shown in FIG. 3, display 14 is formed from flexible substrate 40. Display panel 14P has an array of pixels P forming an active area (active area AA) in which images are displayed for a user. The size of inactive border area IA may be reduced by forming a relatively tight bend in substrate 40. Display driver integrated circuits, board-to-board connectors, and/or other electrical components 42 may be mounted on the inactive tail portions of substrate 40 (e.g., in a region that lies under active area AA).

Figure 4:
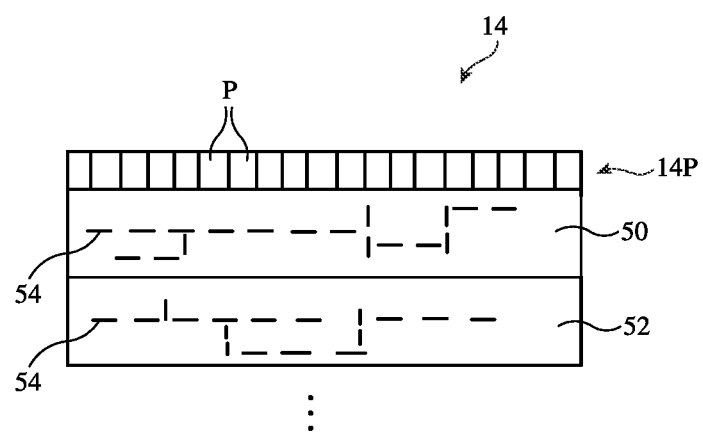
FIG. 4 is a cross-sectional side view of an illustrative display in which an array of pixels is mounted to one or more substrates that contain interconnects for routing control signals, data signals, and power in accordance with an embodiment.

In a second illustrative configuration, which is shown in FIG. 4, the size of the inactive display borders for display 14 may be further reduced or eliminated entirely. As shown in the illustrative arrangement of FIG. 4, an array of pixels P (e.g., an organic light-emitting diode display panel, a display substrate that is populated with an array of microLEDs, etc.) forms display panel 14P. Panel 14P may be mounted on one or more underlying interconnect substrates such as interconnect substrates 50 and 52 in FIG. 4. Interconnects 54 may be formed from patterned metal traces in substrates 50 and 52 and may be used in distributing display signals such as control signals (e.g., gate line signals), display data (e.g., pixel values), power signals (e.g., a positive power supply voltage ELVDD, a ground power supply voltage ELVSS), touch sensor signals, etc. Interconnects 54 may, as an example, be formed using metals such as copper, aluminum, titanium, etc. Multi-layer routing schemes may be implemented by forming the patterned metal traces in substrates 50 and 52 between multiple dielectric layers (e.g., layers of polyimide, epoxy, and/or other dielectric layers). Conductive vias formed from metal or other conductive material may be used to interconnect metal traces in different interconnect layers. Semiconductor fabrication techniques (and semiconductor design rules) and/or printed circuit fabrication techniques (and printed circuit design rules) may be used in forming the interconnect substrates.

Figure 5:
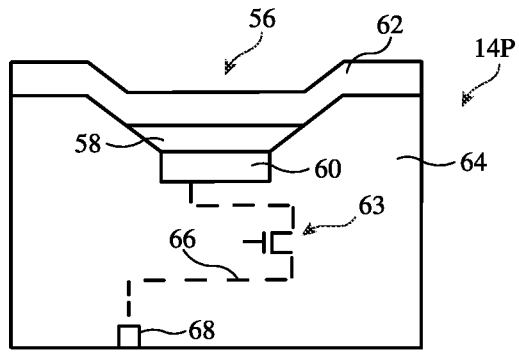
FIG. 5 is a cross-sectional side view of an illustrative organic light-emitting diode display in accordance with an embodiment.

FIG. 5 is a cross-sectional side view of a portion of an illustrative display panel formed from organic light-emitting diodes. As shown in FIG. 5, illustrative display panel 14P of FIG. 5 may include organic light-emitting diode 56. Diode 56 may have organic emissive layer 58 between anode 60 and transparent cathode 62. Thin-film transistor circuitry such as transistor 63 may be formed in substrate 64. Display panel 14P (e.g., substrate 64) may be formed from flexible materials (e.g., polyimide, other polymer layers, etc.). Metal traces 66 in panel 14P may form display panel interconnects that interconnect transistor circuitry such as transistor 63 with electrical contacts (e.g., metal pillars and/or other contact pad structures) such as contact 68. Contacts such as contact 68 may be located on the lower (inwardly facing) surface of panel 14P, which faces the interior of device 10 (e.g., the interior of housing 12).

Figure 6:
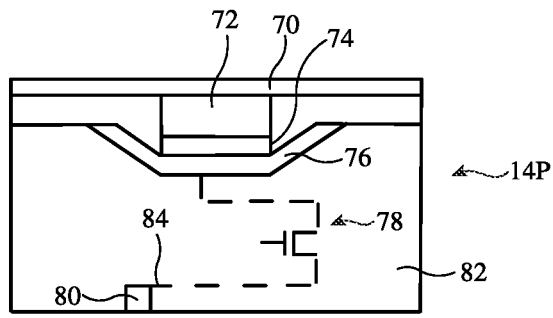
FIG. 6 is a cross-sectional side view of an illustrative display with an array of pixels formed from crystalline semiconductor light-emitting diode dies in accordance with an embodiment.

FIG. 6 is a cross-sectional side view of a portion of an illustrative display panel formed from an array of micro-light-emitting diodes (microLEDs). As shown in FIG. 6, illustrative display panel 14P of FIG. 6 may include light-emitting diodes such as light-emitting diode 72. Light-emitting diodes 72 may be formed from crystalline semiconductor light-emitting diode dies. Each die may have an upper contact (e.g., a first diode terminal) connected to a transparent conductive layer (e.g., an indium tin oxide layer) such as layer 70 and an opposing lower contact (e.g., a second diode terminal). The lower contact may, for example, be connected to display panel interconnects 84 and optional thin-film transistor circuitry such as optional transistor 78 using conductive layer 74 (e.g., a layer of a ductile metal such as indium) and mirror layer 76 (e.g., a mirror layer formed from one or more metal layers such as a TiAlTi layer). Interconnects 84 may be formed from metal traces in substrate 82. Display panel 14P (e.g., substrate 82) may be formed from flexible materials (e.g., polyimide, other polymer layers, etc.). Metal traces 84 in panel 14P may interconnect optional transistor circuitry such as optional transistor 78 with electrical contacts (e.g., metal pillars and/or other contact pad structures) such as contact 80. Contacts such as contact 80 may be located on the lower (inwardly facing) surface of panel 14P.

If desired, thin-film circuitry in substrates 64 and 82 may, if desired, be supplemented and/or replaced by circuitry in one or more integrated circuits (e.g., circuits embedded in substrate 64 and/or 82 and/or circuits coupled to other substrates associated with display 14).

To help reduce inactive display border structures (e.g., inactive display areas that are free of pixels P and that do not produce images), display panels such as panels 14P of FIGS. 5 and 6 may be mounted to underlying interconnect substrates. This obviates the need for providing lateral room for substrate bending in the inactive display area (see, e.g., the bent substrate tail of display panel substrate 40 of FIG. 3).

One or more interconnect substrates may be provided in display 14 and these substrates may be interconnected with display panel 14P using bonding techniques such as anisotropic conductive adhesive bonding, solder bonding, and/or thermal compression bonding. For example, inwardly facing contacts such as contacts 68 of FIG. 5 and contacts such as contacts 80 of FIG. 6 may be connected to corresponding outwardly facing contacts in an interconnect substrate, thereby allowing display signals from the interconnect substrate to be routed to the pixels and circuitry of the display panel and allowing touch signals to be routed from touch sensor electrodes in the display to capacitive touch sensor circuitry in device 10.

Figure 7:
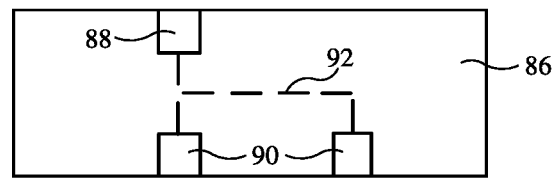
FIG. 7 is a cross-sectional side view of an illustrative substrate with contacts such as metal pillars for interconnecting with other substrates in accordance with an embodiment.

FIG. 7 is a cross-sectional side view of an illustrative interconnect substrate. As shown in FIG. 7, interconnect substrate 86 may have outwardly facing contacts 88 (e.g., contact pads formed from metal pillars such as copper pillars or other conductive structures) and may have inwardly facing contacts 90 (e.g., contact pads formed from metal pillars such as copper pillars or other conductive structures). Vias and other metal traces (interconnects 92 in substrate 86) may be used in routing signals within substrate 86 (e.g., between contacts 90 and contacts 88). There may be one or more layers of interconnect substrates in display 14. For example, a display panel may be connected directly to a single underlying interconnect substrate or a display panel may be connected to a first interconnect substrate that, in turn, is stacked on a second and optionally third and/or fourth interconnect substrates. By using multiple interconnect substrates, tiling schemes and other packaging arrangements can be implemented.

Conductive paths in display panel 14P and interconnect substrates such as substrate 86 (e.g., contacts 68 of FIG. 6, contacts 88 of FIG. 7, and/or contacts 92 of FIG. 7, other interconnects 92, etc.) can be formed by any suitable techniques for depositing and patterning metal and/or any suitable techniques for forming openings in dielectric layers. For example, openings may be formed in dielectric layers by etching (e.g., plasma etching or other dry etching techniques and/or wet etching), by developing photoresist (e.g., using wet development processes to develop exposed photosensitive polymer), by mechanical drilling, by laser drilling (e.g., laser ablation), by cutting, by sawing, lift-off, and/or using other opening formation techniques. Contacts and other interconnects (e.g., metal traces forming vias, externally exposed contact pads, internal conductive patches, and/or other conductive structures for conveying signals) may be formed using plating techniques (e.g., electroplating, electroless plating, etc.), sputter deposition, evaporation, and/or other physical vapor deposition techniques, by deposition of conductive materials using printing techniques (e.g., to deposit metal paste such as silver paste, conductive polymer, silver nanowire material, and/or other conductive material), by reflowing solder, by embedding wires, metal foil, and/or other conductive material in to liquid dielectric and/or molded dielectric, and/or by any other suitable conductive material deposition and/or patterning techniques. As an example, via openings in a polyimide layer or other dielectric layer(s) in display panel 14P and/or one or more interconnect substrates such as substrate 86 that have been formed using laser drilling, photolithography, etching, and/or other opening formation techniques may be filled using sputtering and/or plating, may be filled with conductive paste, and/or may be filled with other conductive material. In some configurations, contact pad structures (e.g., square pads formed in a metal layer on a substrate surface and/or embedded within the substrate) may contact vertical via structures (e.g., pillars formed from plating, sputtering, laser-formed vias filled with solder, silver paste, and/or other conductive material, etc.). For example, metal pads may be embedded in display panel 14P between pixel circuitry in the panel such as thin-film transistor circuitry in the panel and a polyimide substrate for panel 14P and these metal pads may be contacted using conductive vias formed through the polyimide substrate of panel 14P and/or conductive vias (e.g., conductive vias formed from laser-drilled via openings and/or other openings) and/or other conductive paths in an interconnect substrate to which panel 14P is mounted. Vertical conductive structures (e.g., metal pillars formed by sputtering and/or plating, laser-drilled vias filled with metal or other conductive material etc.) are shown by contacts 80 of FIG. 6 and contacts 88 and 90 of FIG. 7 (as an example). By contacting the circuitry of the pixels of panel 14P through the backside of panel 14P, inactive display border regions may be minimized. Backside contacts for display panel 14P may be formed using any type of routing strategy in panel 14P and/or substrates 86 (e.g., using metal pillars and/or other conductive structures formed from sputtering and/or plating and/or deposition of metal paste and/or other conductive material in openings formed by etching, photolithography, laser-drilling, and/or other opening formation techniques).

Figure 8:
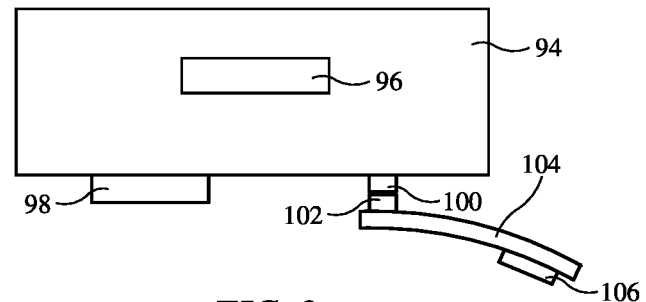
FIG. 8 is a cross-sectional side view of an illustrative substrate for a display showing illustrative locations for an integrated circuit used in operating the display in accordance with an embodiment.

FIG. 8 is a cross-sectional side view of an illustrative substrate. Substrate 94 of FIG. 8 may form a display panel and/or an interconnect substrate. As shown in FIG. 8, integrated circuits, dummy circuits, circuitry for communications, display driver integrated circuits, control circuits, and/or other display integrated circuits may be coupled to the interconnects in substrate 94. If desired, one or more of these integrated circuits may be embedded within substrate 94 (see, e.g., circuit 96). These integrated circuits may also be mounted to the inwardly facing surface of substrate 94 (see, e.g., circuit 98). If desired, connectors (see, e.g., connector 100) may be mounted on the lower surface of substrate 94 (e.g., connector 100 may be a board-to-board connector that mates with corresponding connector 102 of flexible printed circuit 104). A display driver integrated circuit or other display integrated circuit (see, e.g., integrated circuit 106) may be mounted to printed circuit 104 to supply signals to substrate 94. In general, one or more integrated circuits for controlling the operation of display 14 may be embedded in, mounted to, or electrically coupled to the display panels and/or interconnect substrates of display 14. The example of FIG. 8 is illustrative.

Figure 9:
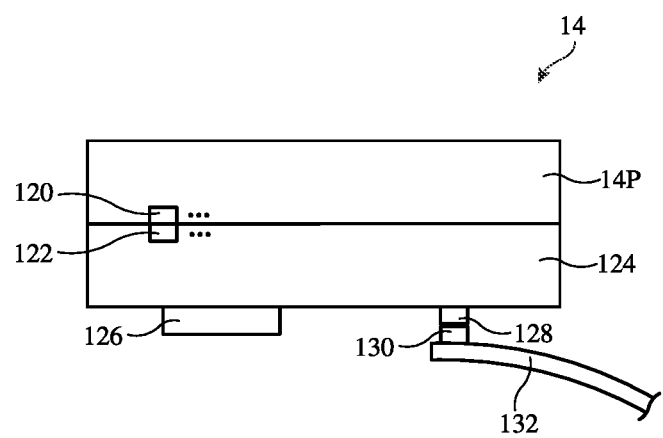
FIG. 9 is a cross-sectional side view of an illustrative display panel mounted to a substrate with interconnects in accordance with an embodiment.

An illustrative configuration for display 14 in which display panel 14P is mounted to an interconnect substrate is shown in FIG. 9. In the arrangement of FIG. 9, display panel 14P, which may sometimes be referred to as a display layer, pixel array, pixel array substrate, pixel substrate, or display substrate, is mounted to interconnect substrate 124. Contacts 120 in display panel 14P are electrically connected to respective contacts 122 in interconnect substrate 124 so that signals can be routed between substrate 124 and display panel 14P. One or more integrated circuits such as integrated circuit 126 (e.g., a display driver integrated circuit) may be mounted to the lower surface of substrate 124. A board-to-board connector such as connector 128 may mate with a corresponding connector 130 on flexible printed circuit 132. Signal paths on printed circuit 132 may couple display 14 to control circuitry in device 10.

Figure 10:
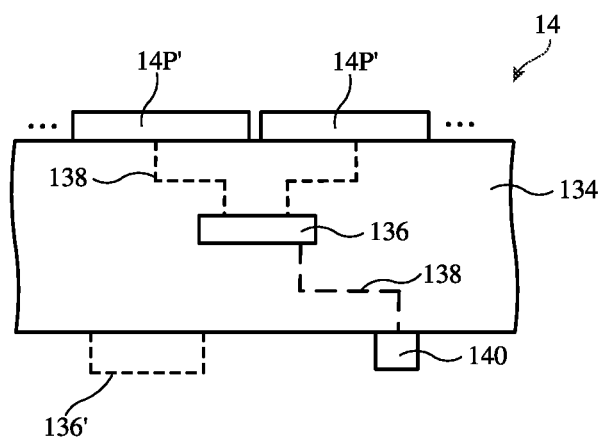
FIG. 10 is a cross-sectional side view of display tiles mounted in an array to a substrate with interconnects and an embedded circuit in accordance with an embodiment.

Another illustrative configuration for display 14 is shown in FIG. 10. The illustrative configuration of FIG. 10 involves the use of display panels 14P' that are arranged (tiled) in a two-dimensional array on the surface of interconnect substrate 134. If desired, each display panel 14' may be separately tested before being included as one of the tiled display panels on the surface of substrate 134. Contacts in each display panel (display panel tile) 14P' are electrically shorted to corresponding contacts in interconnect substrate 134. Substrate 134 has interconnects 138 that route signals through substrate 134. Integrated circuit 136 (e.g., a display driver integrated circuit or other display integrated circuit) may be embedded within substrate 134 or may be mounted to the underside of substrate 134 (see, e.g., illustrative display integrated circuit mounting location 136'). Display 14 may be connected to control circuitry in device 10 using board-to-board connector 140, which is electrically coupled to the signal paths in substrate 134 (e.g., interconnects 138).

Figure 11:
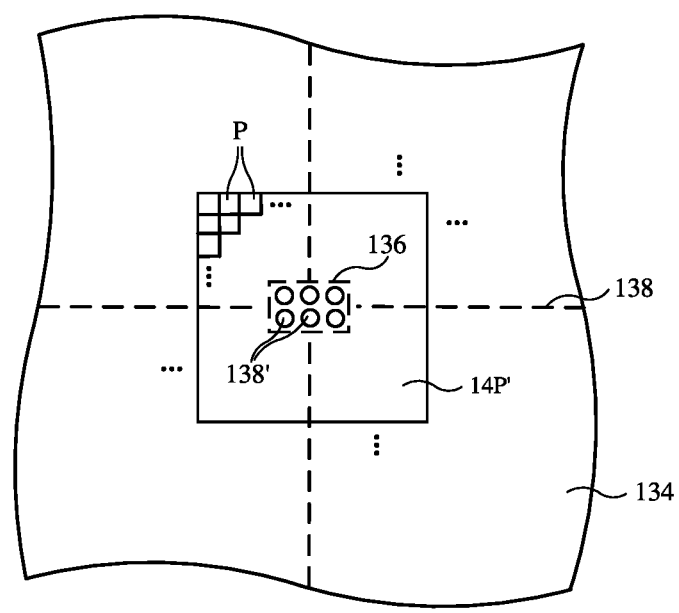
FIG. 11 is a top view of an illustrative substrate that is covered with an array of display tiled display panels each of which has an associated array of pixels and a control circuit for the pixels in accordance with an embodiment.

FIG. 11 is a top view of display 14 showing how multiple display panel tiles (display panels 14P') may be mounted to the surface of interconnect substrate 134. Interconnects 138 may be used to distribute display control signals, display pixel data, power signals, touch sensor signals, and/or other signals within substrate 134. These signals may be conveyed to and/or from display panels 14P' by using interconnects 138 to route signals to/from an integrated circuit such as integrated circuit 136 that is associated with each display panel 14P' (e.g., using interconnect paths such as vias 138' and/or other interconnects 138 to make connections between circuit 136 and an overlapping display panel 14P'). In an illustrative configuration, circuit 136, which may sometimes be referred to as a pixel driver circuit, provides image data to each of the pixels P on panel 14P'. There may be one of circuits 136 for each display panel 14P'. Interconnects 138 may be distributed throughout substrate 134 to ensure that signals are conveyed to and from each display panel tile. Within each display panel tile, display panel interconnects may route signals to and from pixels P and/or touch sensor circuitry within that display panel tile. Other configurations for distributing display signals may be used, if desired. The configuration of FIG. 11 is illustrative.

Figure 12:
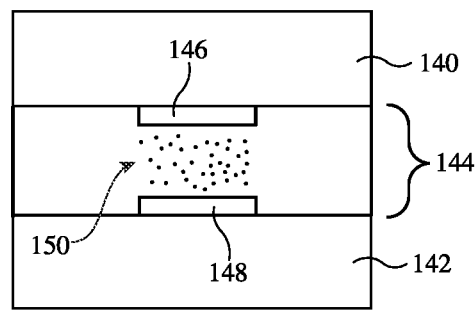
FIG. 12 is a cross-sectional side view of an illustrative substrate-to-substrate electrical connection made using anisotropic conductive film bonding in accordance with an embodiment.
Figure 13:
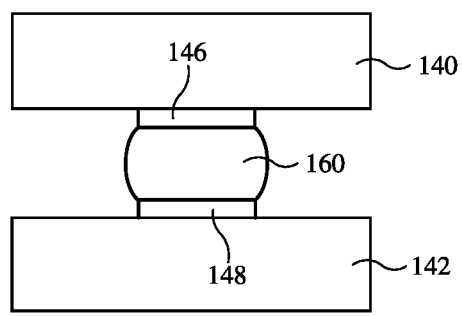
FIG. 13 is a cross-sectional side view of an illustrative substrate-to-substrate electrical connection made using solder bonding in accordance with an embodiment.
Figure 14:
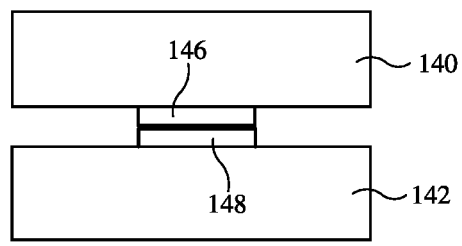
FIG. 14 is a cross-sectional side view of an illustrative substrate-to-substrate electrical connection made using thermal compression bonding in accordance with an embodiment.

Illustrative bonding arrangements for joining stacked substrates in display 14 are shown in FIGS. 12, 13, and 14. In the examples of FIGS. 12, 13, and 14, upper substrate 140 is being joined to lower substrate 142. Substrate 14 has downwardly facing contacts such as contact 146 (and optionally has upwardly facing contacts). Substrate 142 has upwardly facing contacts such as contact 148 (and optionally has downwardly facing contacts). Contacts such as contacts 146 and 148 may be formed from metal (e.g., elemental metal, metal alloys, layers of multiple different metals, etc.) and/or other conductive materials (e.g., carbon, etc.) and may include vias, pillars, pads, and/or other conductive contact structures. Contacts 146 and 148 may be coupled to internal metal traces in substrates 140 and 142 (e.g., thin-film circuitry for interconnects, power routing, data and control lines, etc.). Upper and/or lower substrates 140 and/or 142 may include display panel substrates, and interconnect substrates such as printed circuit substrates formed using semiconductor fabrication design rules and/or printed circuit design rules, interposer substrates that may be joined between display panels, etc.

In the example of FIG. 12, substrates 140 and 142 are being joined by anisotropic conductive adhesive layer 144. As substrates 140 and 142 are pressed together, adhesive 144 is compressed in regions such as region 150 between corresponding contacts 146 and 148. Uncompressed portions of adhesive 144 remain insulating. The compression of layer 144 in region 150, however, renders the portion of layer 144 in region 150 conductive and thereby electrically shorts contacts 146 and 148 together.

In the example of FIG. 13, contacts 146 and 148 are being joined (bonded) using a solder joint formed from solder 160.

Electrical connections can also be formed using other techniques. For example, contacts 146 and 148 may be joined using thermocompression bonding. As shown in FIG. 14, thermocompression bonds (diffusion bonds) may be created by bonding contacts 146 and 148 directly together by application of heat and pressure. Thermocompression bonds may be formed using contacts formed from a metal such as Al, Au, Cu, and/or other thermocompression bonding materials.

If desired, underfill may be provided between substrates 140 and 142 of FIGS. 13 and 14. For example, polymeric edge underfill may be provided around edge regions or the area between substrates 140 and 142 may be fully underfilled with polymer underfill. The use of underfill may help mechanically strengthen the mechanical attachment of substrates 140 and 142 without adversely affecting the electrical connections being made. If desired, joint size can vary. For example, solder joints or thermal compression bonds may have different sizes based on location (e.g., joint size may be larger for joint locations farther away from the center of the bonded substrates). Using underfill and/or variable joint sizing may help minimize shear forces between substrates 140 and 142 and thereby reduce warpage. The fatigue lifetime for the joints may also be enhanced.

Illustrative operations involved in forming a display panel are shown in FIGS. 15, 16, 17, 18, 19, and 20. In this example, a display panel with light-emitting diodes formed from crystalline semiconductor light-emitting diode dies is being formed. Other types of display panel may be formed, if desired (e.g., organic light-emitting diode display panels, etc.).

A shown in FIG. 15, a temporary layer such as transparent glass substrate 150 or other transparent substrate may serve as a temporary platform for forming thin-film layers for display panel 14P. Initially, sacrificial layer 152, polymer layer 154 (e.g., a polyimide layer), buffer layer 156 (e.g., an inorganic stress compensation layer with a thickness of 0.6 microns to 1 micron or other suitable thickness that helps prevent warpage in glass substrate 150), and adhesive layer 158 are formed on substrate 150.

Openings such as illustrative opening 160 may be formed in layers 158, 156, and 154, as shown in FIG. 16 (e.g., by etching). The depth of opening 160 may be about 10 microns, at least 5 microns, less than 20 microns, or other suitable size. The width of opening 160 may be about 50-200 microns, at least 5 microns, at least 25 microns, less than 1000 microns, less than 400 microns, or other suitable size.

As shown in FIG. 17, electroplating seed layer (coating) 162 may be deposited after forming opening 160. Coating 162 may be conformal and may coat the sidewalls of opening 160.

As shown in FIG. 18, a photoresist layer such as layer 164 may be formed on top of coating 162 and a photoresist opening may be formed in alignment with opening 160.

Electroplating operations may then be used to grow pillar 166 (e.g., a copper pillar in opening 160) and photoresist layer 164 may be stripped, as shown in FIG. 19.

During subsequent operations, display panel 14P may be formed from thin-film circuitry 168 on layer 150, as shown in FIG. 20. Display panel 14P may be free of embedded integrated circuits or may include an embedded integrated circuit in the dielectric layer(s) in circuitry 168 (e.g., an embedded integrated circuit may be used distributing pixel data to pixels and/or performing other display integrated circuit functions and this integrated circuit may be attached to adhesive layer 158). Patterned vias and other metal traces 172 may form multiple layers of interconnects in dielectric layers 174. Light-emitting diodes 180 may have upper and lower contacts. The upper contacts may be electrically shorted to transparent layer 182 (e.g., an indium tin oxide layer or other transparent conductive layer that forms a first diode terminal). The lower contacts (which form a second diode terminal) may be connected to interconnects 172 via metal layers 178 (e.g., layers of indium or other ductile metal) and 176. Passivation layer 184 may cover metal 176 and exposed metal traces.

Figure 21:
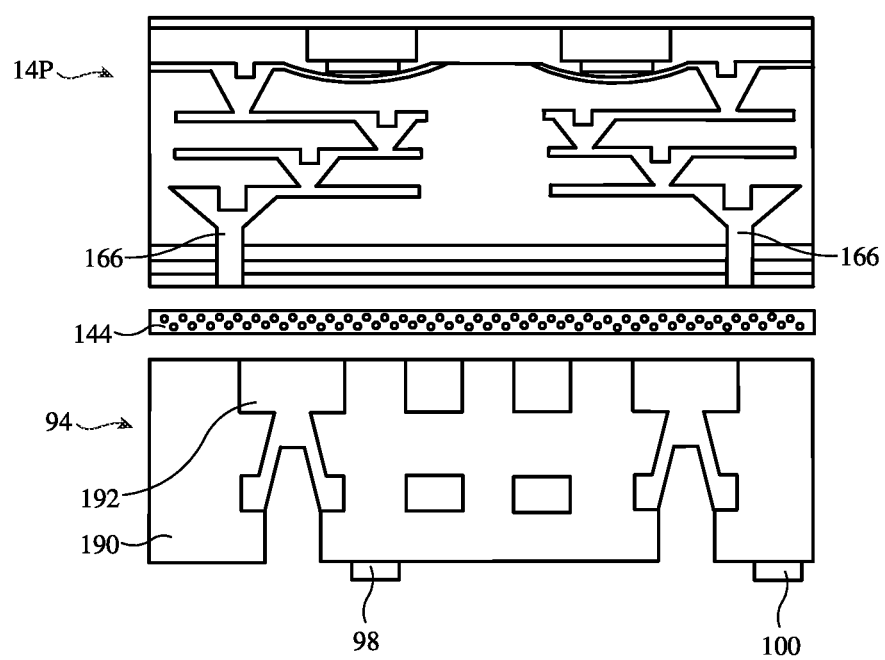
FIG. 21 is a cross-sectional side view of a display panel for a display that is being bonded to a substrate with interconnects in accordance with an embodiment.

After forming display panel 14P on substrate 150, panel 14P may be removed from sacrificial layer 152 and substrate 150 (e.g., using backside laser-assisted lift-off procedures in which laser pulses are applied to the underside of layer 150, which is transparent). As shown in FIG. 21, the resulting exposed lower portions of pillars 166 of panel 14P form contacts that can mate with corresponding contacts in one or more interconnect substrates. Anisotropic conductive adhesive layer 144 and/or other bonding layer (e.g., a layer of solder joints, thermocompression bonds, and/or other electrical connections) may be used in joining the signal paths of display panel 14P with the signal paths of substrate 94. In the illustrative configuration of FIG. 21, panel 14P is being bonded to interconnect substrate 94, which has a dielectric layer 190 that contains metal traces 192 forming contacts that mate with pillars 166 and other interconnects. Display integrated circuit 98 and board-to-board connector 100 may be mounted to the lower side of substrate 94 in contact with interconnects formed from traces 192 (as an example). Optional additional interconnect substrates, optional embedded integrated circuits, and/or other components can be included, if desired. The example of FIG. 21 is illustrative.

FIGS. 22, 23, 24, 25, 26, 27, 28, and 29 are cross-sectionals side views of illustrative configurations for forming displays from display panels and interconnect substrates in accordance with embodiments.

In the examples of FIGS. 22, 23, 24, and 25, display 14 includes supporting substrate 200. Substrate 200 may be, for example, a glass layer. Interconnect substrate 202 may be attached to substrate 200 (e.g., using an adhesive layer). Display 14 may include one or more display integrated circuits such as display driver integrated circuit 204 and one or more display integrated circuits such as pixel driver integrated circuits 208, which may sometimes be referred to as tile driver circuits, display panel control circuits, etc. Each pixel driver integrated circuit may supply signals to a corresponding array of pixels P on a corresponding display panel (tile) 14P'. There may be, as an example, an N×N array of pixels P on each panel 14P', where N is at least 5, at least 10, at least 12, 16, at least 25, less than 30, 50, less than 30, less than 20, less than 10, or other suitable value. There may be any suitable number of tiles (display panels 14P') in display 14 (e.g., at least 10, at least 100, at least 1000, fewer than 1,000,000, fewer than 100,000, fewer than 10,000, fewer than 2000, fewer than 500, fewer than 75, or other suitable number). Display driver integrated circuits 204 may be coupled to control circuitry in device 10. Image content may be supplied to display driver integrated circuit(s) 204 by the control circuitry so that display 14 may display the image content. Display driver integrated circuit(s) 204 may distribute image data to pixel driver circuits 208 using interconnects in interconnect substrate 202 and interconnects in the substrate forming each display panel (tile) 14P'. Integrated circuits such as circuit 204 or other display circuitry may, if desired, gather touch sensor data (e.g., directly from touch sensor electrodes or other sensor circuitry and/or from circuits such as circuits 208 that are associated with each display panel 14P').

Figure 22:
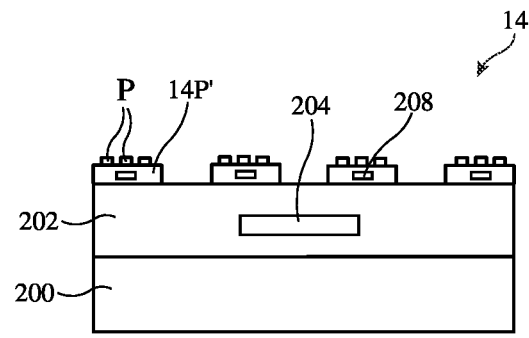
FIGS. 22, 23, 24, 25, 26, 27, 28, and 29 are cross-sectionals side views of illustrative configurations for forming displays from display panels and interconnect substrates in accordance with embodiments.
Figure 23:
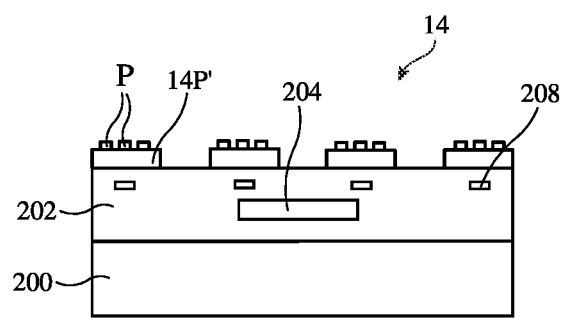
Figure 24:
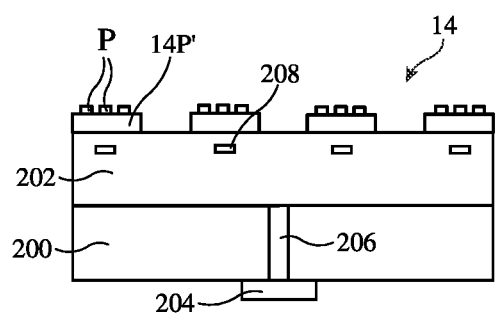
Figure 25:
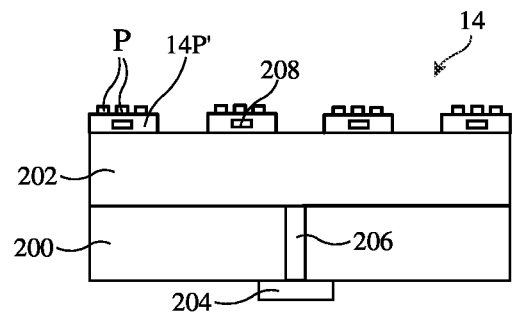

In the examples of FIGS. 22 and 23, one or more display driver integrated circuits such as display driver integrated circuit 204 (sometimes referred to as timing controller integrated circuits) are embedded in interconnect substrate 202. In the examples of FIGS. 24 and 25, vias 206 (sometimes referred to as through-glass vias) connect interconnect substrate 202 to one or more display driver integrated circuits such as circuit 204 on the inwardly facing surface of glass layer 200. In the examples of FIGS. 22 and 25, pixel driver integrated circuits 208 have been embedded within the tiles (display panels 14P') of display 14. In the examples of FIGS. 23 and 24, integrated circuits 208 have been embedded in interconnect substrate 202 adjacent to respective display panels 14P'.

Figure 26:
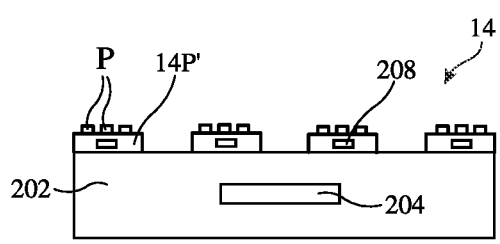
Figure 27:
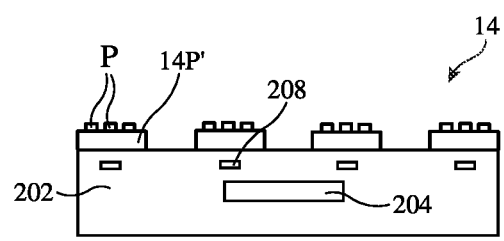
Figure 28:
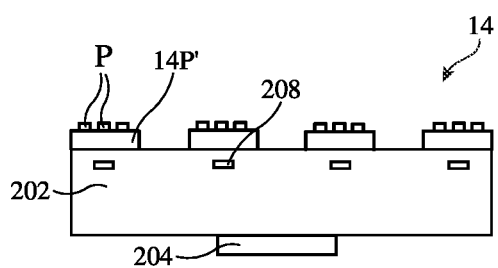
Figure 29:
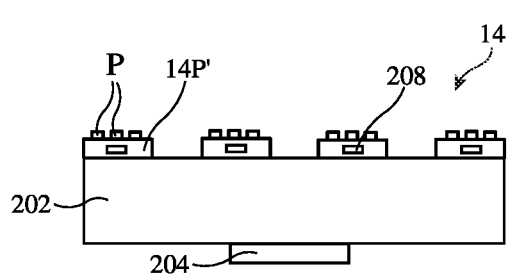

In the example of FIG. 26, glass layer 200 of FIG. 22 has been omitted. In the example of FIG. 27, glass layer 200 of FIG. 23 has been omitted. In the example of FIG. 28, glass layer 200 of FIG. 24 has been omitted, so integrated circuit 204 has been mounted to the inwardly facing surface of interconnect substrate 202 rather than the inwardly facing surface of glass layer 200. In the example FIG. 29, glass layer 200 of FIG. 25 has been omitted, so integrated circuit 204 has been mounted to the inwardly facing surface of interconnect substrate 202 rather than the inwardly facing surface of glass layer 200.

Figure 30:
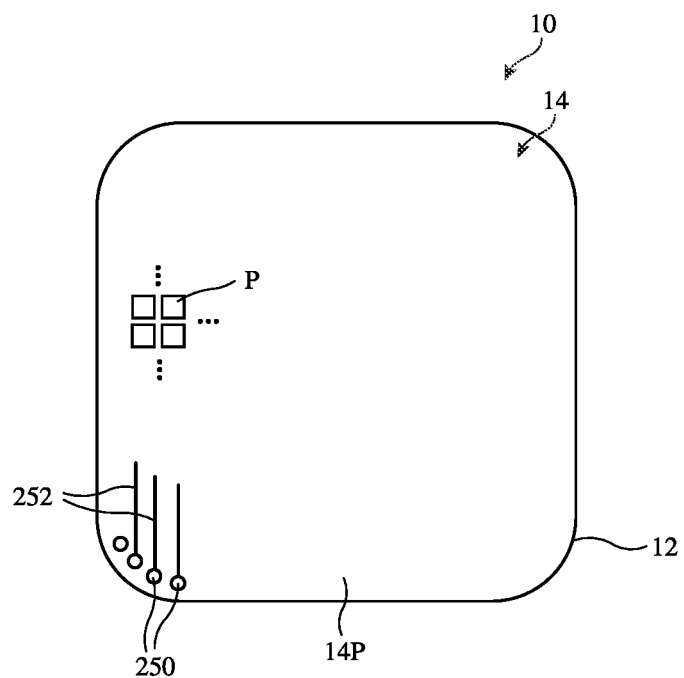
FIG. 30 is a top view of an illustrative electronic device having a display active area with rounded corners in accordance with an embodiment.

To accommodate curved corners of housing 12, display 14 may be provided with curved peripheral edges (e.g., at the corners of display 14 and/or other edge portions of display 14). This type of arrangement is shown in FIG. 30. Display 14 may have an array of pixels P formed using a narrow border arrangement. For example, display 14 may contain a display panel that has vias and inwardly facing contact pads along the peripheral edges of the display panel to avoid the need for bending a tail portion of the substrate as described in connection with the bent tail of flexible substrate 40 of FIG. 3. In this type of arrangement, it may be desirable for the display panel (e.g., panel 14P of FIG. 30) to have contacts (e.g., pads) that are electrically shorted to pads on an underlying substrate. On panel 14P, conductive paths 252 (e.g., data lines, gate lines, power lines, etc.) may be used to route signals between pads 250 and pixels P. On the interconnect substrate on the underside of panel 14P, metal pillars or other contacts are shorted to pads 250.

Figure 31:
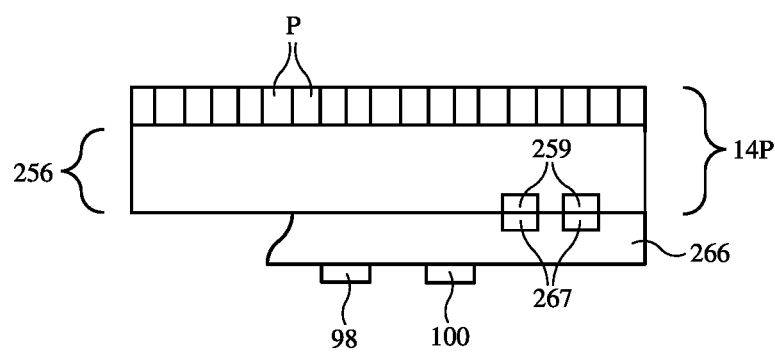
FIG. 31 is a cross-sectional side view of a display with electrical connections between the display panel and a substrate with interconnects in accordance with an embodiment.

In an illustrative arrangement, pads 250 are formed along the peripheral edge of display 14, as shown in FIG. 30. A cross-sectional diagram of an illustrative display with peripheral backside contact pads is shown in FIG. 31. As shown in FIG. 31, display panel 14P of display 14 has an array of pixels P (e.g., organic light-emitting diode pixels or other pixels). Pixels P may be covered with a layer of encapsulation. Panel 14P may have interconnect layer 256 with metal traces forming contacts 259 (e.g., metal pillars). Contacts 259 may be electrically connected to contacts 267 in interconnect layer 266. A board-to-board connector on layer 266 such as connector 100 may be used to connect the circuitry of display 14 to other circuitry in device 10. Display driver circuitry 98 or other display circuits on layer 266 may be used to control panel 14P.

Figure 32:
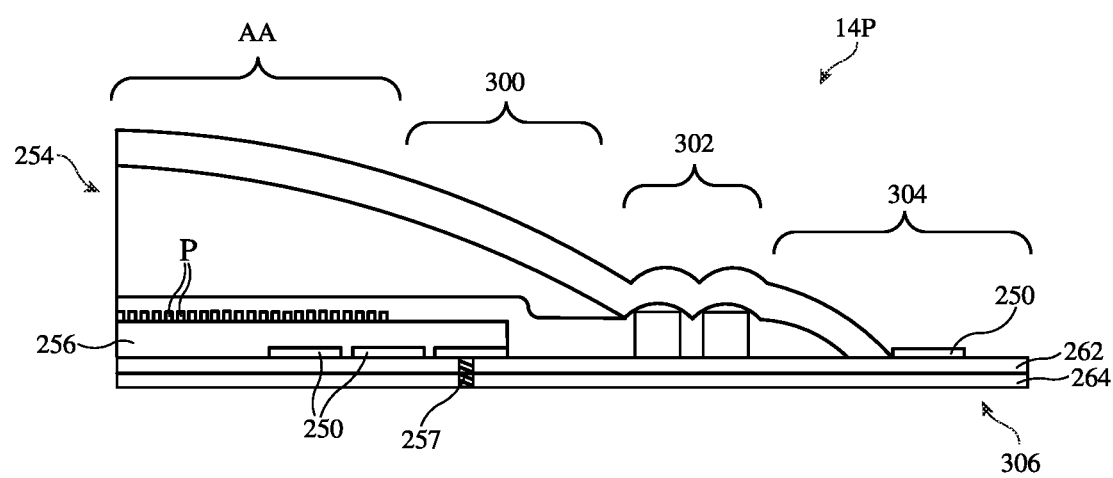
FIG. 32 is a cross-sectional side view of an illustrative edge portion of a display having contact pads in accordance with an embodiment.

A cross-sectional side view of an edge portion of display panel 14P of FIG. 31 is shown in FIG. 32. As shown in FIG. 32, display panel 14P may have an active area such as active area AA in which pixels P are configured to display an image for a user. Encapsulation 254 covers pixels P and extends toward peripheral edge 306 of panel 154. Encapsulation 254 may include cured liquid polymer, inorganic layers, and/or other encapsulant. Polymer substrate 262 (e.g., a polyimide substrate) may be attached to underling structures such as illustrative interconnect substrate 266 of FIG. 31, may be coupled to a flexible printed circuit that contacts only a peripheral edge portion of panel 14P, or may be coupled to contacts in other underlying circuitry. Openings may be formed in layers 262 and 264 in alignment with pads 250 to allow conductive paste or other conductive material to be used in shorting pads 250 to interconnects in the attached interconnect substrate (e.g., metal traces in a rigid printed circuit, metal traces in a flexible printed circuit, etc.). Pads 250 are embedded within panel 14P between substrate layer 262 and the thin-film circuitry of interconnect layer 256 and pixels P (e.g., layer 262 has a first surface that faces pixels P on which pads 250 are formed and has an opposing second surface and vias are formed through layer 262 from the second surface to the first surface formed). As shown in FIG. 32, backside connections to pads 250 may be formed from metal-filled vias such as via 257 through layers 262 and 264. Vias such as via 257 may include metal formed by sputtering and/or plating and/or may include conductive metal paste, solder, and/or other conductive materials. Openings for vias 257 may be formed using any suitable via opening formation technique (etching, drilling, laser drilling, etc.). The conductive material in the via openings may coat the sidewalls of the openings and/or may fill the openings entirely.

Encapsulation 254 may have layers of organic material, inorganic layers (e.g., silicon nitride and/or silicon oxide layers to block moisture), and/or other encapsulation layer(s). Layer 254 may cover pixels P in active area AA. Dam structures 302, which run around the peripheral edge of display 14, may help control the outward flow of encapsulation layer 254 toward outermost display substrate edge 306 during fabrication. Interconnect and thin-film circuitry layer 256 includes metal traces that form signal paths that are coupled to pads 250. To ensure sufficient space for forming pads 250, some of pads 250 may be formed under pixels P in active area AA, some of pads 250 may be formed in region 300 between active area AA and dam structures 302, and some of pads 250 may be formed between dam structures 302 an outer peripheral edge 306. It may be desirable to avoid placing pads 250 under dam structures 302 (e.g., to avoid creating undesirable texture in structures 302 that might reduce encapsulation effectiveness).

Figure 33:
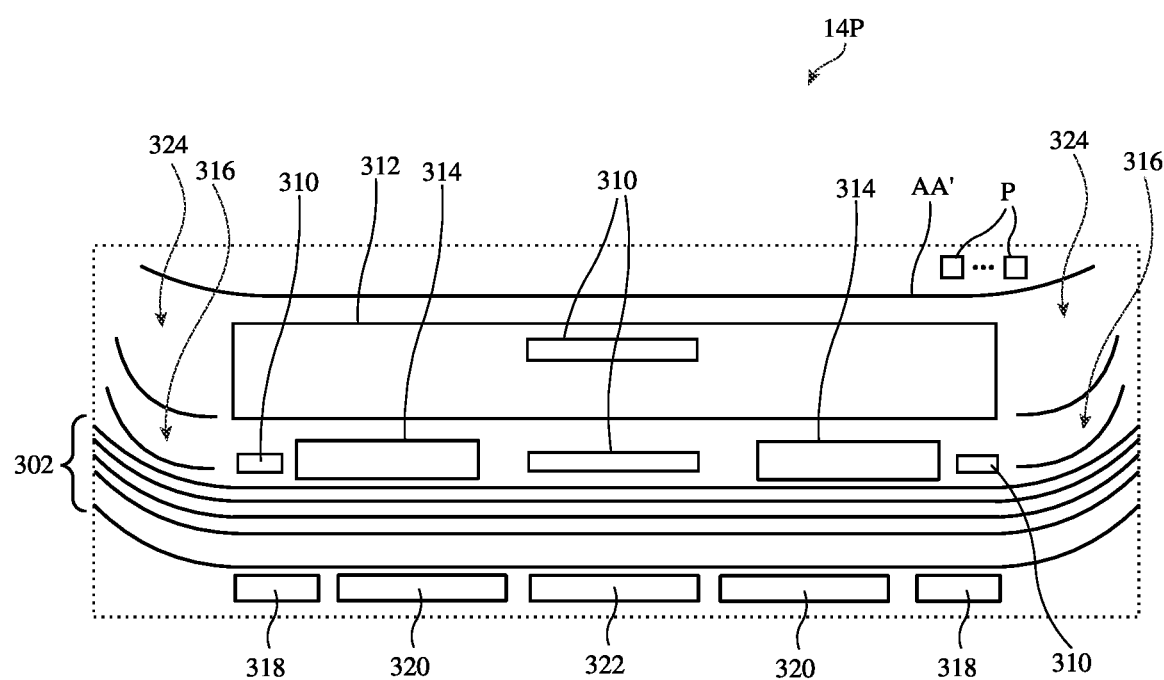
FIG. 33 is a top view of a lower portion of an illustrative electronic device display with rounded active area corners in accordance with an embodiment.

FIG. 33 is a top view of a lower edge portion of device 10 showing an illustrative layout that may be used for bonding pads and other circuitry in display panel 14P. The lower end of panel 14P (e.g., a portion of panel 14P that includes lower left and lower right curved corners) is shown in FIG. 33.

As shown in FIG. 33, line AA' separates pixels P in the active area of display panel 14P' from peripheral portions of panel 14P that contain pads 250 and other circuitry. At the left and right corners (lower left and lower right corners of FIG. 33), active area AA is curved. The pixels that are vertically above the curved edges of panel 14P are sometimes referred to as spline region pixels and this portion of the display panel is sometimes referred to as the spline portion of the display. In the middle of display 14P (e.g., at locations between the corners), the lower edge of active area AA is straight. The pixels that are vertically above this straight-edge section of panel 14P are sometimes referred to as non-spline pixels and this portion of the display panel is sometimes referred to as the non-spline portion of the display panel.

In the illustrative configuration of FIG. 33, region 312 may contain pads 250 corresponding to pixels P that are not located on the curved corner portions of panel 14P' (sometimes referred to as non-spline data pads). Regions 314 may contain pads 250 that correspond to pixels P along the curved corners of panel 14P. Thin-film gate driver circuitry may be located in regions 316. Pads 250 such as positive power supply (ELVDD) pads may be located in region 322. Pads 250 such as ground power supply (ELVSS) pads may be located in regions 318. Pads 250 such as touch sensor pads may be located in regions 320. Regions 324, which may sometimes be referred to as fan out regions, may be used for forming routing lines (fan out paths) for pixels P in columns extending from the curved corners of panel 14P (sometimes referred to as spline pixels).

Dam structures 302 may be located between the pads of regions 318, 320, and 320 and the pads of regions 314 and 312. Panel 14P may have any suitable number of metal layers (e.g., at least three, at least four, at least five, fewer than ten, fewer than six, etc.). As an example, panel 14P may include a first metal layer G1, a second metal layer G2, a third metal layer SD1, and a fourth metal layer SD2. Regions 310 may correspond to SD1/DS2 contact locations for the traces for ELVSS and ELVDD.

Figure 34:
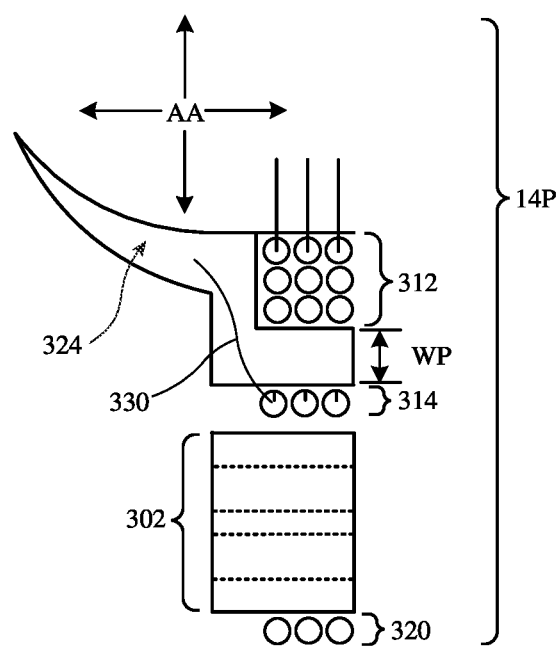
FIGS. 34, 35, and 36 are top views of illustrative layouts for contact pads, routing lines, and other circuit resources in an electronic device display such as the display of FIG. 33 in accordance with an embodiment.

FIG. 34 shows an illustrative configuration that may be used to form routing paths 330 (fanout lines for the pads in pads 250 that serve the spline pixels associated with the curved corner portions of panel 14P) in region 324 using metal traces in the G1 and/or G2 layer. A slight border penalty (width WP) may be incurred using this type of approach.

Figure 35:
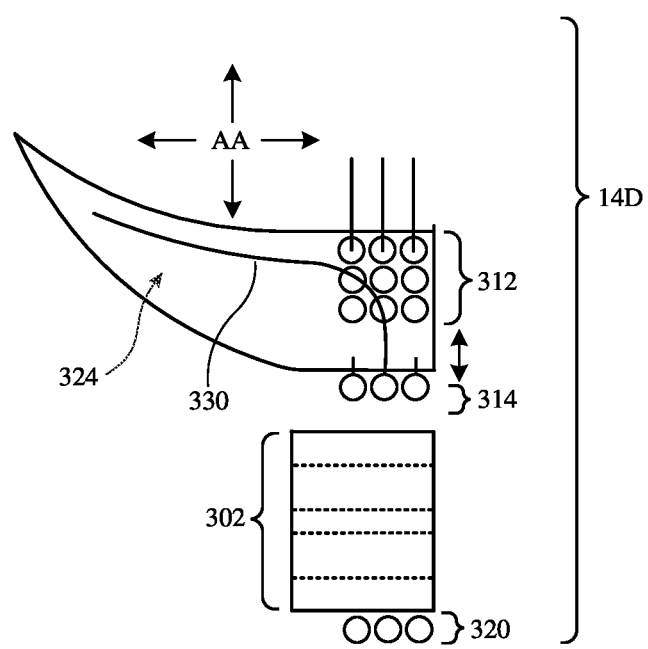

An alternative routing path arrangement for the spline pads is shown in FIG. 35. With this type of arrangement, the third metal layer (SD1) may be used in forming routing paths 330. This allows paths 330 to extend over pads in region 312, which may help to conserve space. Some of the SD2 metal layer may be used to help hide traces in the SD1 metal layer.

Figure 36:
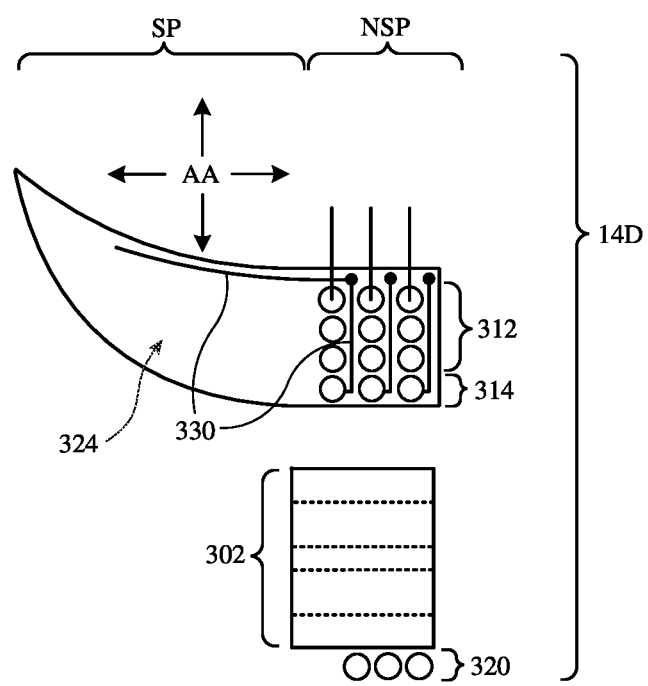

In the illustrative routing path arrangement for the spline pads that is shown in FIG. 36, the fourth metal layer (SD2) is used for forming routing paths 330. Paths 330 are used to carry spline data (data for columns of pixels P in spline portion SP of panel 14P) over non-spline pads 312 (pads for pixels in non-spline portion NSP of panel 14P) to spline pads in region 314. Pads 250 may be formed from two layers of metal on panel 14P or other suitable numbers of metal layers.

Figure 37:
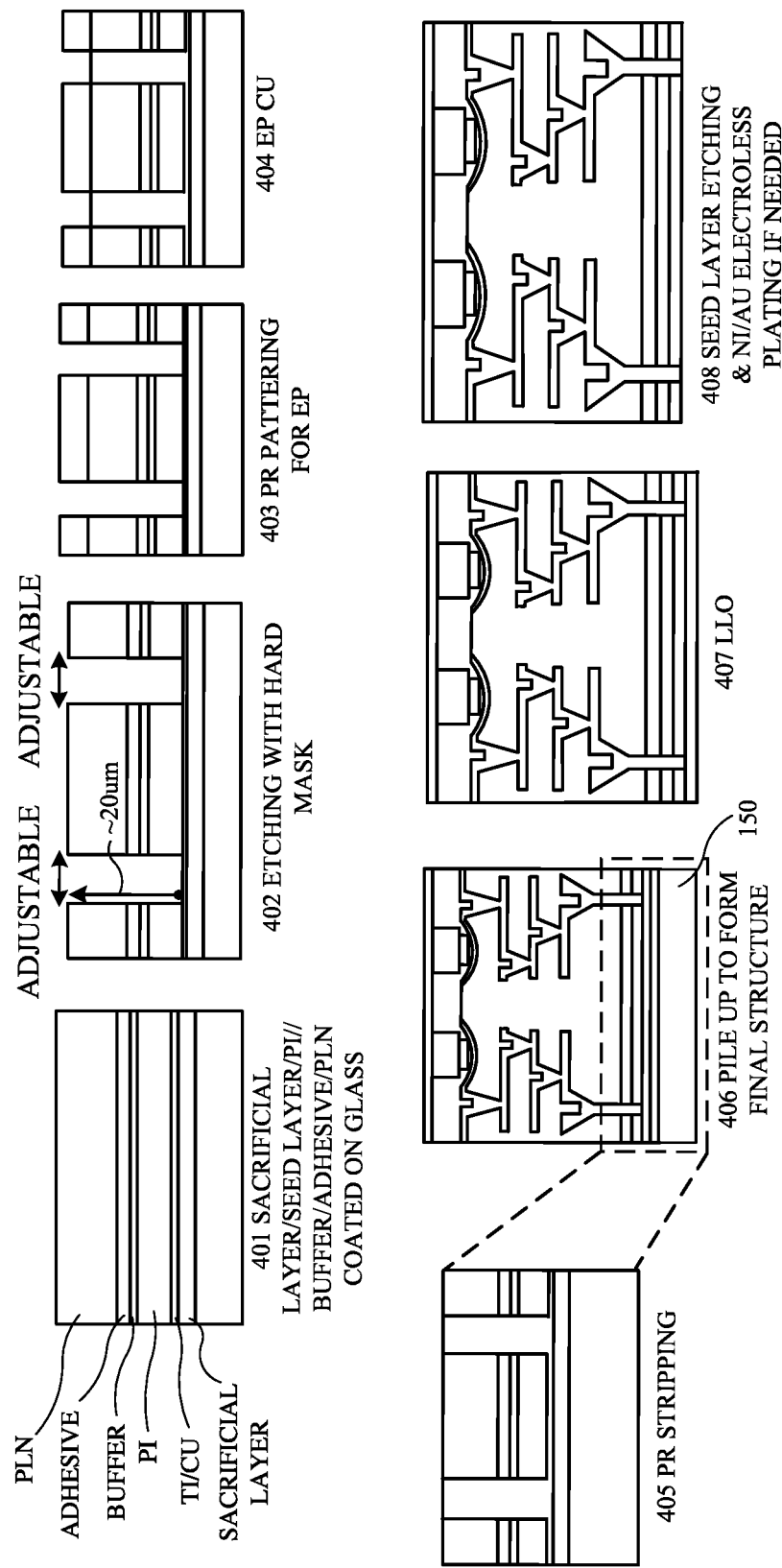
FIG. 37 is a process flow diagram showing illustrative steps involved in forming a display panel with backside contacts in accordance with an embodiment.
Figure 38:
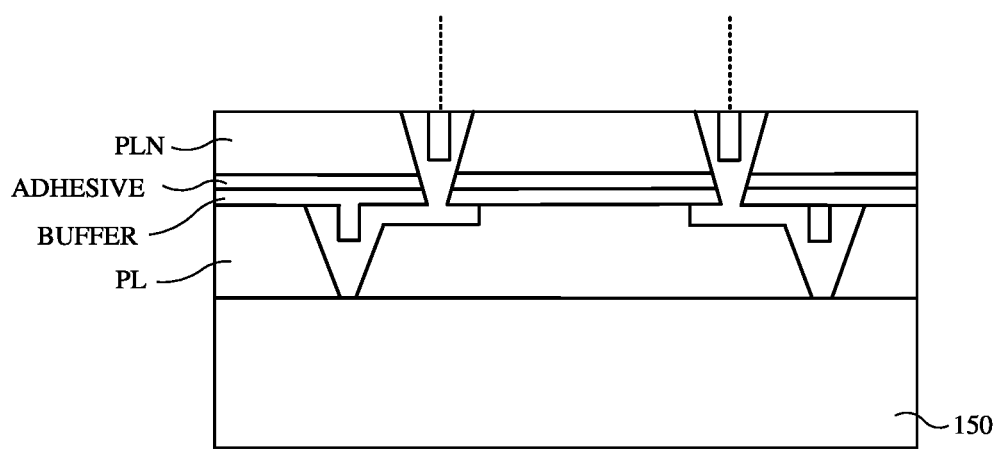
FIG. 38 is a cross-sectional side view of an illustrative layer with bottom surface contacts in accordance with an embodiment.

FIG. 37 is a diagram of illustrative operations involved in forming a display panel with backside contacts. During step 401, a sacrificial layer, a metal layer (e.g., a Ti/Cu layer), a polymer layer (e.g., a polyimide layer PI), a buffer layer, a layer of adhesive, and a planarization layer (PLN) may be deposited to begin forming interconnect layers for a display panel. Circuitry (e.g., integrated circuit dies) may be embedded in layer PLN or layer PLN may be free of embedded circuitry. Openings may then be formed in the deposited layers as shown at step 402, followed by photoresist (PR) depositing and patterning (step 403) and metal deposition such as copper electroplating (step 404). The deposited photoresist may then be stripped (step 405) and a display layer with pixels may be attached (step 406) so that the exposed surfaces of the contacts formed from the electroplating or other metal deposition step mate with corresponding downwardly facing contacts in the display layer. Following laser lift off operations (step 407) to remove the layers of display panel 14P from temporary substrate 150, seed layer etching and optional metal plating operations (e.g., Ni/Al electroless plating) may be performed on panel 14P (step 408). FIG. 38 shows how in addition to or instead of using electroplating, sputtering or other metallization techniques may alternatively be used to bring contacts to the bottom surfaces of display layers and/or interconnect substrates.

These signal routing schemes for panel 14P may be used for both portrait and landscape architectures, may be used for single-fanout layouts (e.g., top only for portrait, right only for landscape), may be used for split fanout layouts (e.g., top/bottom for portrait, left/right for landscape), and/or may be used for other suitable layouts.

Figure 39:
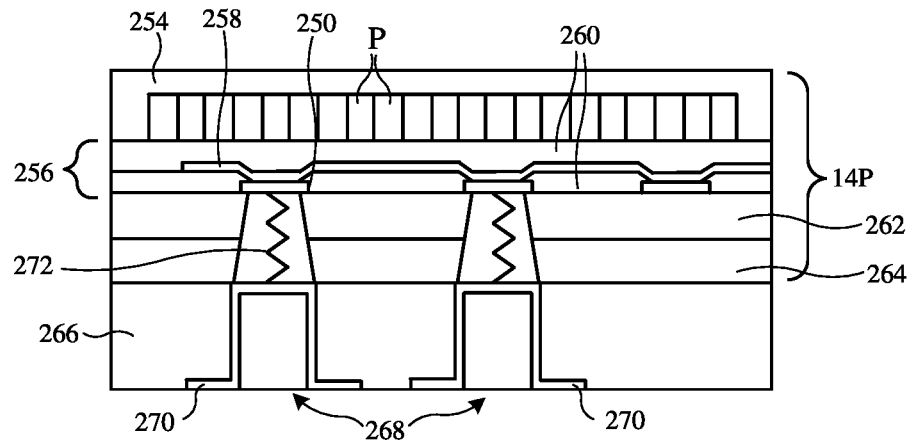
FIGS. 39, 40, and 41 are cross-sectional side views of a display with backside contacts showing illustrative methods for forming electrical connections with contacts in an interconnect substrate in accordance with embodiments.
Figure 40:
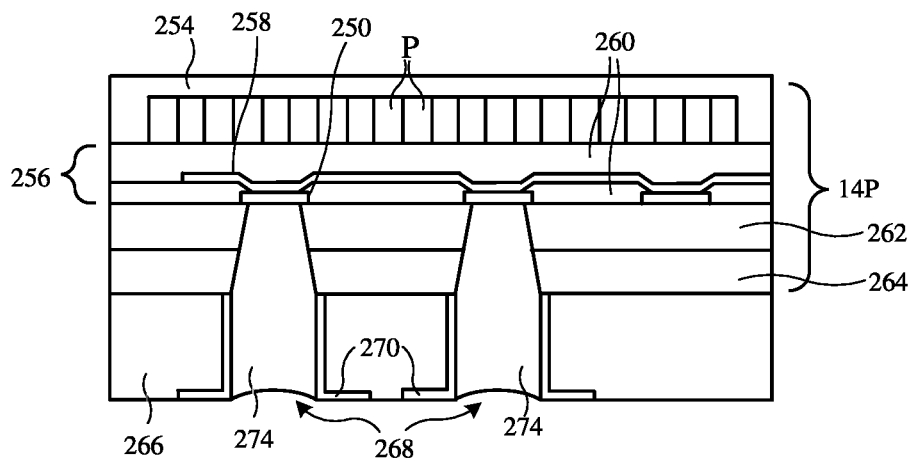
Figure 41:
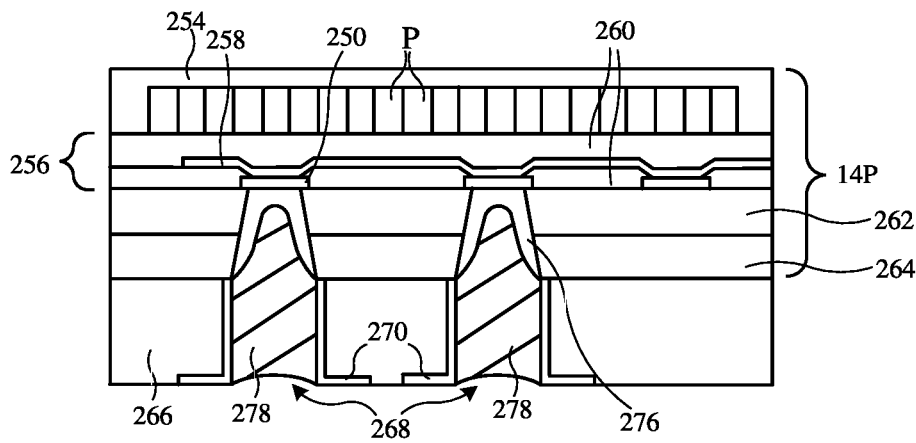

FIGS. 39, 40, and 41 show illustrative methods for forming electrical connections for a display with backside contacts (e.g., peripheral backside contacts of the type shown in FIG. 30, which may be formed along one, two, three, or more edges of display 14 and housing 12). As shown in FIG. 39, display panel 14P of display 14 has an array of pixels P (e.g., organic light-emitting diode pixels or other pixels) encapsulated by encapsulation 254 on interconnect layer 256. Layer 256 includes metal traces 258 embedded in dielectric layers 260 on substrate 262 (e.g., a polyimide substrate). Adhesive layer 264 may be used to attach display panel 14P to interconnect substrate 266.

Metal traces 258 have portions forming contacts such as pads 250. Pads 250 face inwardly and are exposed by openings through substrate 262 and adhesive layer 264. Interconnect substrate 266 has corresponding openings filled with conductive material forming contacts 268 that mate with pads 250. The openings in substrate 262, adhesive layer 264, and/or the openings in substrate 266 may be formed by laser etching, dry etching (e.g., plasma etching), and/or other processing techniques.

The conductive material in the openings of substrate 266 may include metal spring members, metal traces deposited by physical vapor deposition and patterned using photolithography or other patterning techniques, conductive paste such as silver paste or other conductive paste, and/or other conductive materials. Metal traces and/or other interconnects in substrate 266 are used to form signal paths between display panel 14P and electrical components on the underside of substrate 266 (e.g., integrated circuits and other electrical components such as display driver circuitry, connectors (e.g., board-to-board-connectors), and/or other circuits coupled to contacts 268), thereby electrically connecting this circuitry to pixels P. A board-to-board connector that is coupled to contacts 268 may be used to connect the circuitry of display 14 to other circuitry in device 10.

In the example of FIG. 39, contacts (electrical connections) 268 have been formed from metal traces 270 in substrate 266 and springs 272 in the openings through adhesive layer 264 and substrate 262 of panel 14P. In the example of FIG. 40, contacts 268 have been formed by filling the openings in substrate 266, substrate 262, and layer 264 with conductive paste 274. In the illustrative configuration of FIG. 41, contacts 268 have been formed by depositing a first conductive structure (metal layer 276) in the openings in substrate 266, substrate 262, and layer 264 using a physical vapor deposition process such as sputtering and by subsequently depositing a second conductive structure (e.g., conductive paste 278) in the remaining unfilled portions of the openings in substrate 266, substrate 262, and layer 264. If desired, plated metal or other metal traces 270 may be used in forming portions of contacts 268 of FIGS. 39, 40 and 41 (e.g., plated metal or other metal may coat portions of the interior walls of the openings in substrate 266). Exposed portions of traces 270 may form contact structures such as solder pads or other contact pads to which electrical components can be mounted. In general, the through-hole openings in interconnect substrate 266 may be filled with any suitable conductive structures for forming electrical connections with mating inwardly facing pads 250 of display panel 14P (e.g., springs, plated metal traces or other metal traces that are coated on the sidewalls of the through-hole openings, conductive paste, sputtered metal, etc.). These techniques and/or other arrangements may be used to form conductive structures that serve as signal paths through openings (vias) in substrate 266, substrate 262, and layer 264 that are formed by laser drilling, plasma etching or other dry etching techniques, photolithography, drilling, and/or other hole formation techniques, thereby coupling circuitry that is mounted to the underside of interconnect substrate 266 to the circuitry of display panel 14P.

Figure 42:
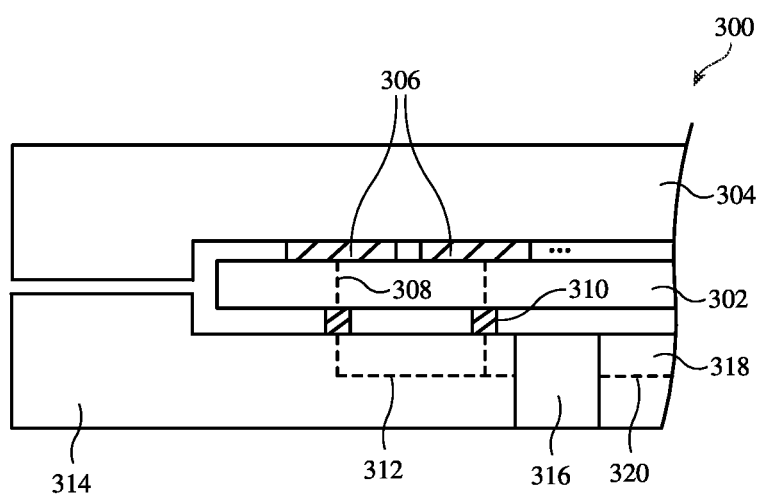
FIG. 42 is a cross-sectional side view of an illustrative electronic device structure having a display cover layer in accordance with an embodiment.

FIG. 42 is a cross-sectional side view of a portion of an illustrative electronic device with a display. As shown in FIG. 42, device 300 (e.g., device 10 of FIG. 1) may include display 302. Display 302 may include an array of pixels for producing images. Display 302 may be covered with a transparent protective layer such as display cover layer 304. Display cover layer 304 may be formed from a clear material such as transparent polymer, glass, ceramic, crystalline material such as sapphire, other transparent materials, and/or combinations of these materials. If desired, transparent conductive structures may be formed between display (display panel) 302 and display cover layer 304. For example, transparent conductive structures 306 (e.g., pads, lines, etc. formed from a patterned indium-tin oxide layer) that are formed on the inner surface of display cover layer 304 may be used to form capacitive touch sensor electrodes, antennas, and/or other conductive structures.

Interconnect substrate 318 may have circuitry 320 (e.g., signal lines, electrical components, etc.). Circuitry 320 may be coupled to board-to-board connector 316. Conductive paths in board-to-board connector 316 may be coupled to conductive paths 312 in support structure 314 (e.g. a dielectric frame). Contacts 310 on structure 314 may be shorted to signal paths 308 through display 302. In this way, antennas, touch sensor electrodes, and/or other conductive structures 306 on the inner surface of display cover layer 304 may be electrically coupled to circuitry 320. Circuitry 320 may include radio-frequency transceiver circuitry (e.g., circuitry such as circuitry 22 of FIG. 1) that uses antennas on layer 304 to transmit and/or receive radio-frequency wireless communications signals, may include control and processing circuitry (e.g., control circuitry 20 of FIG. 1), and/or may include sensors 16 and/or other input-output devices 24 (FIG. 1). If desired, circuitry 320 may include conductive structures that form sensor electrodes, near-field communications antennas, wireless power coils for transmitting and/or receiving wireless power signals, and/or other conductive structures for handling electromagnetic functions during the operation of device 10. The circuitry of substrate 318 may be coupled to circuitry in display 302 and/or other circuitry using pads under a display active area, contacts under a display encapsulation area that does not contain pixels and/or contacts outside of the display encapsulation area (e.g., at the outermost edge of display 302).

Figure 43:
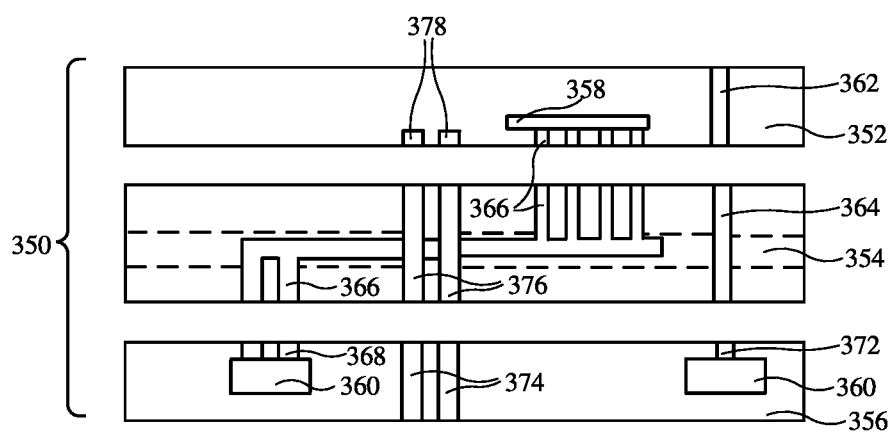
FIG. 43 is a cross-sectional side view of an illustrative display and associated layers with optical interconnects and other components in accordance with an embodiment.

FIG. 43 is an exploded view of stacked interconnect substrate layers that may be joined to form interconnect substrate 350. In this example, top substrate layer 352, which may sometimes be referred to as a thin-film transistor layer backplane, may have contacts that couple to an overlapping array of pixels and/or may include an array of pixels (e.g., thin-film organic light-emitting diode pixels, crystalline light-emitting diode dies forming pixels, etc.). One or more organic and/or inorganic dielectric layers may be used in forming top substrate layer 352, middle substrate layer 354, and lower substrate layer 356. For example, middle substrate layer 354 may be formed from a stack of polymer layers (e.g., three polyimide layers in the example of FIG. 43).

Metal traces, embedded electrical components (e.g., integrated circuits, sensors, etc.), optical waveguides, and/or other structures may be formed within the substrate layers of substrate 350. The conductive signal paths of each of the substrate layers may be electrically coupled with each other when substrate layers 352, 354, and 356 are stacked on top of each other to form substrate 350.

Consider, as an example, conductive lines 374, 376, and 378. When layers 352, 354, and 356 are joined, lines 374, 376, and 378 may be electrically coupled to each other so that power and/or data can be conveyed throughout substrate 350. This allows integrated circuits and other components to be powered and to transmit and receive data.

Optical paths may be formed from polymer waveguides or other optical waveguides. As shown on the right-hand side of FIG. 43, for example, substrate layer 352 may contain a vertically extending waveguide 362 that receives ambient light from the external environment surrounding device 10, substrate layer 354 may include a vertically extending waveguide 364 that optically couples to waveguide 362, and substrate layer 356 may contain an optical waveguide 372 that optically couples to waveguide 364 and thereby provides guided ambient light to optical receiver 360 (e.g., a receiver such as a color or monochrome ambient light sensor formed from one or more photodetectors or other sensors 16). If desired, a light emitter may be coupled to these vertically extending waveguides.

Optical interconnect paths may also be formed from optical waveguides. As shown in the example of FIG. 43, substrate layer 356 may include optical transceiver 370. Transceiver 370 may include transmitter circuitry and/or receiver circuitry. For example, transceiver 370 may include an optical transmitter having light-emitting devices (light-emitting didoes, lasers such as vertical cavity surface emitting lasers, etc.). Layer 352 may have corresponding transceiver circuitry 358 with optical transmitter and/or receiver circuitry. For example, transceiver circuitry 358 may include an optical receiver having light detectors (e.g., one or more photodiodes). Optical waveguides 368 of layer 356 may be optically coupled to optical waveguides 366 in layer 354, which may, in turn, be optically coupled to optical waveguides 366 in layer 352. These optical waveguides may be used to form an optical path between transceiver circuitry 370 and transceiver circuitry 358. This allows the light-emitting devices of circuitry 370 to transmit optical data that is subsequently received by the photodetectors or other components of circuitry 358.

Figure 44:
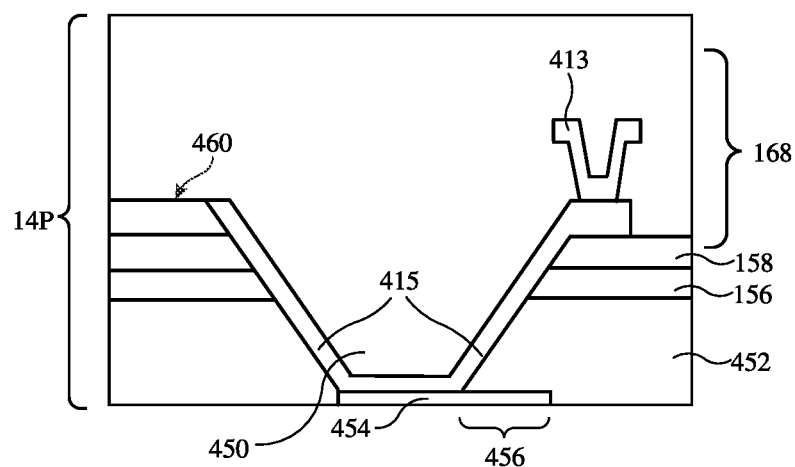
FIG. 44 is a cross-sectional side view of an illustrative display panel with backside contacts in accordance with an embodiment.

FIG. 44 is a cross-sectional side view of an illustrative display panel with backside contacts. In the example of FIG. 44, display panel 14P has layers that are formed on a glass carrier (not shown) covered with a sacrificial layer (e.g. a silicon or polyimide sacrificial layer for a laser-assisted lift-off process, not shown in FIG. 44).

After preparing the carrier by deposition of the sacrificial layer, the layers of FIG. 44 may be formed on the sacrificial layer. First, a metal layer such as metal layer 454 may be deposited and patterned. Portions of this layer such as illustrative portion 456 of FIG. 44 may subsequently serve as backside contacts (e.g., planar backside contact pads) and may be connected to integrated circuits, board-to-board connectors, printed circuits, etc.

Polymer layer 452 may be deposited over metal layer 454. Layer 452 may be, for example, a photoimageable polymer such as photopatternable polyimide. After depositing layer 452, layer 452 may be patterned to form via openings. Buffer layer 156 (e.g., an inorganic stress compensation layer) and adhesive layer 158 may then be deposited on layer 452 followed by cleaning operations (e.g., a dry etch) to remove residual portions of these layers from the via sidewalls. Via sidewall metal 415 may then be deposited to form conductive vias and optional embedded components (e.g., integrated circuits, etc.) can be attached to surface 460 of adhesive layer 158. Metal 415 may be a thin-film metal layer deposited by physical vapor deposition or other techniques and may sometimes be referred to herein as a physical vapor deposition thin-film metal layer. Following deposition of polymer 450 in the via (e.g., one or more planarization layers, sometimes referred to as planarization polymer or via-filling planarization polymer), vias and other interconnect structures in circuitry 168 such as illustrative via 413 can be formed in contact with via sidewall metal 415 and an array of pixels for display panel 14P may be formed at the top of circuitry 168. In this way, circuitry 168 for display panel 14P is electrically coupled to the backside bond pad formed from region 456 of metal layer 411.

Figure 45:
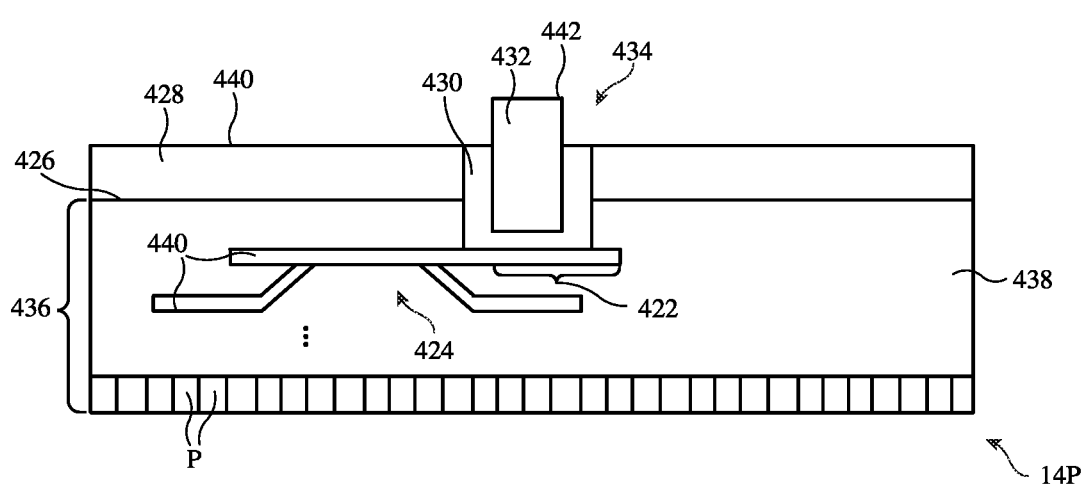
FIG. 45 is a cross-sectional side view of another illustrative display panel with backside contacts in accordance with an embodiment.

In the illustrative example of FIG. 45, display circuitry 436 is formed by depositing dielectric layers 438 and metal traces 440 on a carrier substrate. During these deposition and processing operations, surface 426 of dielectric layers 438 is supported by the carrier (e.g., on a sacrificial layer on the carrier). Metal traces 440 may be patterned to form vias such as via 424 and other interconnect circuitry (e.g., while circuitry 436 is right-side up with surface 426 at the bottom of circuitry 436). Optional integrated circuits and other components may be embedded in dielectric layers 438. At the top of layers 438 (the bottom of the page in the orientation of FIG. 45), circuitry 436 may include an array of pixels P for forming display panel 14P.

Following formation of circuitry 436, circuitry 436 may be flipped over and may temporarily assume the upside down orientation shown in FIG. 45. In this orientation, polyimide layer 428 may be deposited on surface 426. A photoresist layer may then be deposited and patterned on surface 440 of polyimide layer 428. The patterned photoresist layer may have openings through which openings in polyimide layer 428 and portions of layers 438 may be etched, thereby exposing portions of traces 440 (e.g., in region 422 of FIG. 45).

Electrodeposition seed layer 430 may then be deposited through the openings to contact the exposed surface of metal trace 440 in regions such as region 422 followed by electrodeposition of metal 432. Metal 432 may be copper tin, copper silver, nickel or nickel alloys, and/or other elemental metals and/or metal alloys. Exposed surface 442 of metal 432 may, if desired, be proud of surface 440 or may be flush with surface 440. Exposed portions of backside metal such as surface 442 may be used as backside contacts. If desired, vias can be formed to contact metal trace 440 in regions such as region 442 (e.g. using physical vapor deposition and photolithographic patterning) rather than depositing seed layer 430 and electrodepositing metal 432. The example of FIG. 45 is illustrative.

The foregoing is merely illustrative and various modifications can be made to the described embodiments. The foregoing embodiments may be implemented individually or in any combination.

What is claimed is:

1. An electronic device, comprising:
    a housing; and
    a display in the housing, wherein the display has a plurality of tiled display panels, an interconnect substrate to which the display panels are coupled, and a glass substrate configured to support the interconnect substrate.

2. The electronic device defined in claim 1 further comprising a display driver integrated circuit embedded in the interconnect substrate.

3. The electronic device defined in claim 2 wherein each of the display panels has an associated pixel driver integrated circuit configured to provide signals for a plurality of pixels on that display panel.

4. The electronic device defined in claim 3 wherein the pixel driver integrated circuits are embedded in the display panels.

5. The electronic device defined in claim 3 wherein the pixel driver integrated circuits are embedded in the interconnect substrate.

6. The electronic device defined in claim 1 wherein the glass substrate has through-glass vias coupled to interconnect paths in the interconnect substrate.

7. The electronic device defined in claim 1 further comprising a display integrated circuit that is electrically coupled to interconnect paths in the interconnect substrate by through-glass vias in the glass substrate.

8. The electronic device defined in claim 7 wherein each of the display panels has an associated pixel driver integrated circuit configured to supply data to a plurality of pixels on that display panel.

9. The electronic device defined in claim 8 wherein the pixel driver integrated circuits are embedded in the display panels.

10. The electronic device defined in claim 8 wherein the pixels driver integrated circuits are embedded in the interconnect substrate.

11. The electronic device defined in claim 1 wherein each display panel has organic light-emitting diode pixels.

12. The electronic device defined in claim 1 wherein each display panel has crystalline semiconductor light-emitting diode dies.

13. The electronic device defined in claim 1 wherein each display panel has inwardly facing contacts and wherein the interconnect substrate has mating outwardly facing contacts.

14. The electronic device defined in claim 13 wherein the inwardly facing contacts are coupled to the outwardly facing contacts with anisotropic conductive adhesive.

15. The electronic device defined in claim 13 wherein the inwardly facing contacts are coupled to the outwardly facing contacts with solder.

16. The electronic device defined in claim 13 wherein the inwardly facing contacts are coupled to the outwardly facing contacts with thermal compression bonds.

17. An electronic device, comprising:
    a housing; and
    a display in the housing comprising a display panel with an array of pixels and an interconnect substrate having interconnects that are electrically coupled to the array of pixels, wherein the interconnect substrate comprises a structure selected from the group consisting of: an optical waveguide, a near-field communications antenna, and a wireless power coil.

18. The electronic device defined in claim 17, further comprising:
    control circuitry in the interconnect substrate configured to supply image signals to the display via the interconnects.

19. An electronic device, comprising:
    a housing; and
    a display in the housing, wherein the display includes
        a plurality of tiled display panels,
        an interconnect substrate coupled to the display panels, and
        a display driver integrated circuit embedded within the interconnect substrate.

20. The electronic device defined in claim 19 wherein each display panel has inwardly facing contacts and wherein the interconnect substrate has outwardly facing contacts that mate with the inwardly facing contacts.

21. The electronic device defined in claim 20 wherein the inwardly facing contacts are coupled to the outwardly facing contacts via an anisotropic conductive adhesive.

22. The electronic device defined in claim 20 wherein the inwardly facing contacts are coupled to the outwardly facing contacts via solder.

23. The electronic device defined in claim 20 wherein the inwardly facing contacts are coupled to the outwardly facing contacts via thermal compression bonds.

24. The electronic device defined in claim 19 wherein each of the display panels comprises an associated pixel driver integrated circuit configured to provide image data for a plurality of pixels on that display panel.

25. The electronic device defined in claim 24 wherein the pixel driver integrated circuits are embedded in the display panels.

26. The electronic device defined in claim 24 wherein the pixel driver integrated circuits are embedded in the interconnect substrate.

27. The electronic device defined in claim 19 wherein each display panel comprises organic light-emitting diode pixels.

28. The electronic device defined in claim 19 wherein each display panel comprises crystalline semiconductor light-emitting diode dies.

* * * * *